(12) United States Patent
Kaul et al.

(10) Patent No.: US 7,446,044 B2
(45) Date of Patent: Nov. 4, 2008

(54) CARBON NANOTUBE SWITCHES FOR MEMORY, RF COMMUNICATIONS AND SENSING APPLICATIONS, AND METHODS OF MAKING THE SAME

(75) Inventors: Anupama B. Kaul, Arcadia, CA (US); Eric W. Wong, Los Angeles, CA (US); Richard L. Baron, Verdugo City, CA (US); Larry Epp, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 106 days.

(21) Appl. No.: 11/523,273

(22) Filed: Sep. 19, 2006

(65) Prior Publication Data

US 2008/0233744 A1    Sep. 25, 2008

Related U.S. Application Data

(60) Provisional application No. 60/718,585, filed on Sep. 19, 2005, provisional application No. 60/797,735, filed on May 3, 2006.

(51) Int. Cl.
*B81B 7/02* (2006.01)
*H01L 21/44* (2006.01)

(52) U.S. Cl. .......... 438/684; 438/685; 438/903; 438/FOR. 248; 257/382; 257/383; 977/876; 977/938; 333/193

(58) Field of Classification Search .......... 438/684, 438/685, 903, FOR. 248; 257/382, 282; 977/876, 938
See application file for complete search history.

(56) References Cited

U.S. PATENT DOCUMENTS

| | | | |
|---|---|---|---|
| 6,574,130 B2 | 6/2003 | Segal et al. | |
| 6,643,165 B2 | 11/2003 | Segal et al. | |
| 6,682,677 B2 * | 1/2004 | Lobovsky et al. | 264/172.11 |
| 6,706,402 B2 | 3/2004 | Rueckes et al. | |
| 6,759,693 B2 | 7/2004 | Vogeli et al. | |
| 6,764,628 B2 * | 7/2004 | Lobovsky et al. | 264/172.15 |
| 6,774,052 B2 | 8/2004 | Vogeli et al. | |
| 6,784,028 B2 | 8/2004 | Rueckes et al. | |
| 6,803,725 B2 * | 10/2004 | Jin | 315/3.5 |
| 6,835,591 B2 | 12/2004 | Rueckes et al. | |
| 6,836,424 B2 | 12/2004 | Segal et al. | |
| 6,875,374 B1 * | 4/2005 | Zhan et al. | 252/502 |
| 6,911,682 B2 | 6/2005 | Rueckes et al. | |
| 6,919,592 B2 | 7/2005 | Segal et al. | |

(Continued)

*Primary Examiner*—Thanh V Pham
(74) *Attorney, Agent, or Firm*—Joseph B. Milstein; Hiscock & Barclay, LLP

(57) ABSTRACT

Switches having an in situ grown carbon nanotube as an element thereof, and methods of fabricating such switches. A carbon nanotube is grown in situ in mechanical connection with a conductive substrate, such as a heavily doped silicon wafer or an SOI wafer. The carbon nanotube is electrically connected at one location to a terminal. At another location of the carbon nanotube there is situated a pull electrode that can be used to elecrostatically displace the carbon nanotube so that it selectively makes contact with either the pull electrode or with a contact electrode. Connection to the pull electrode is sufficient to operate the device as a simple switch, while connection to a contact electrode is useful to operate the device in a manner analogous to a relay. In various embodiments, the devices disclosed are useful as at least switches for various signals, multi-state memory, computational devices, and multiplexers.

32 Claims, 19 Drawing Sheets

U.S. PATENT DOCUMENTS

| | | |
|---|---|---|
| 6,924,538 B2 | 8/2005 | Jaiprakash et al. |
| 6,942,921 B2 | 9/2005 | Rueckes et al. |
| 6,944,054 B2 | 9/2005 | Rueckes et al. |
| 6,979,590 B2 | 12/2005 | Rueckes et al. |
| 6,982,903 B2 | 1/2006 | Bertin et al. |
| 6,990,009 B2 | 1/2006 | Bertin et al. |
| 6,995,046 B2 | 2/2006 | Rueckes et al. |
| 7,045,421 B2 | 5/2006 | Rueckes et al. |
| 7,056,758 B2 | 6/2006 | Segal et al. |
| 7,071,023 B2 | 7/2006 | Bertin et al. |
| 7,075,141 B2 | 7/2006 | Rueckes et al. |
| 7,112,464 B2 | 9/2006 | Jaiprakash et al. |
| 7,112,493 B2 | 9/2006 | Bertin et al. |
| 7,113,426 B2 | 9/2006 | Rueckes et al. |
| 7,115,901 B2 | 10/2006 | Bertin et al. |
| 7,115,960 B2 | 10/2006 | Bertin et al. |
| 7,138,832 B2 | 11/2006 | Bertin et al. |
| 2002/0113335 A1* | 8/2002 | Lobovsky et al. ........... 264/184 |
| 2003/0165074 A1 | 9/2003 | Segal et al. |
| 2003/0165648 A1* | 9/2003 | Lobovsky et al. ......... 428/36.9 |
| 2003/0234407 A1 | 12/2003 | Vogeli et al. |
| 2003/0236000 A1 | 12/2003 | Vogeli et al. |
| 2004/0075159 A1 | 4/2004 | Vogeli |
| 2004/0075379 A1* | 4/2004 | Jin ............................ 313/495 |
| 2004/0077107 A1 | 4/2004 | Vogeli |
| 2004/0085805 A1 | 5/2004 | Segal et al. |
| 2004/0087162 A1 | 5/2004 | Vogeli |
| 2004/0096389 A1* | 5/2004 | Lobovsky et al. ........ 423/447.1 |
| 2004/0108550 A1* | 6/2004 | Jin ............................ 257/342 |
| 2004/0159833 A1 | 8/2004 | Rueckes et al. |
| 2004/0164289 A1 | 8/2004 | Rueckes et al. |
| 2004/0175856 A1 | 9/2004 | Jaiprakash et al. |
| 2004/0181630 A1 | 9/2004 | Jaiprakash et al. |
| 2004/0191978 A1 | 9/2004 | Rueckes et al. |
| 2004/0214366 A1 | 10/2004 | Segal et al. |
| 2004/0214367 A1 | 10/2004 | Segal et al. |
| 2005/0035344 A1 | 2/2005 | Bertin et al. |
| 2005/0035367 A1 | 2/2005 | Bertin et al. |
| 2005/0035786 A1 | 2/2005 | Bertin et al. |
| 2005/0035787 A1 | 2/2005 | Bertin et al. |
| 2005/0036365 A1 | 2/2005 | Bertin et al. |
| 2005/0037547 A1 | 2/2005 | Bertin et al. |
| 2005/0041465 A1 | 2/2005 | Rueckes et al. |
| 2005/0041466 A1 | 2/2005 | Rueckes et al. |
| 2005/0047244 A1 | 3/2005 | Rueckes et al. |
| 2005/0052894 A1 | 3/2005 | Segal et al. |
| 2005/0053525 A1 | 3/2005 | Segal et al. |
| 2005/0054128 A1* | 3/2005 | Gasparyan et al. ............ 438/29 |
| 2005/0056825 A1 | 3/2005 | Bertin et al. |
| 2005/0056866 A1 | 3/2005 | Bertin et al. |
| 2005/0056877 A1 | 3/2005 | Rueckes et al. |
| 2005/0058590 A1 | 3/2005 | Sen et al. |
| 2005/0058797 A1 | 3/2005 | Sen et al. |
| 2005/0058834 A1 | 3/2005 | Rueckes et al. |
| 2005/0059176 A1 | 3/2005 | Rueckes et al. |
| 2005/0059210 A1 | 3/2005 | Rueckes et al. |
| 2005/0062035 A1 | 3/2005 | Bertin et al. |
| 2005/0062062 A1 | 3/2005 | Bertin et al. |
| 2005/0062070 A1 | 3/2005 | Bertin et al. |
| 2005/0063210 A1 | 3/2005 | Segal et al. |
| 2005/0063244 A1 | 3/2005 | Bertin et al. |
| 2005/0065741 A1 | 3/2005 | Segal et al. |
| 2005/0067607 A1* | 3/2005 | Zhan et al. .................. 252/502 |
| 2005/0074569 A1* | 4/2005 | Lobovsky et al. .......... 428/36.9 |
| 2005/0074926 A1 | 4/2005 | Bertin et al. |
| 2005/0101112 A1 | 5/2005 | Rueckes et al. |
| 2005/0128788 A1 | 6/2005 | Segal et al. |
| 2005/0174842 A1 | 8/2005 | Bertin et al. |
| 2005/0191495 A1 | 9/2005 | Rueckes et al. |
| 2005/0237781 A1 | 10/2005 | Bertin et al. |
| 2005/0269553 A1 | 12/2005 | Sen et al. |
| 2005/0269554 A1 | 12/2005 | Sen et al. |
| 2005/0270824 A1 | 12/2005 | Bertin et al. |
| 2005/0279988 A1 | 12/2005 | Bertin |
| 2005/0280436 A1 | 12/2005 | Bertin |
| 2005/0281084 A1 | 12/2005 | Rueckes et al. |
| 2005/0282515 A1 | 12/2005 | Bertin |
| 2005/0282516 A1 | 12/2005 | Bertin |
| 2006/0044035 A1 | 3/2006 | Bertin |
| 2006/0061389 A1 | 3/2006 | Bertin |
| 2006/0125033 A1 | 6/2006 | Segal et al. |
| 2006/0128049 A1 | 6/2006 | Jaiprakash et al. |
| 2006/0183278 A1 | 8/2006 | Berin et al. |
| 2006/0193093 A1 | 8/2006 | Bertin et al. |
| 2006/0204427 A1 | 9/2006 | Ghenciu et al. |
| 2006/0231865 A1 | 10/2006 | Rueckes et al. |
| 2006/0237857 A1 | 10/2006 | Bertin et al. |
| 2006/0250843 A1 | 11/2006 | Bertin et al. |
| 2006/0250856 A1 | 11/2006 | Bertin et al. |
| 2006/0255834 A1 | 11/2006 | Bertin |
| 2006/0276056 A1 | 12/2006 | Ward et al. |

* cited by examiner

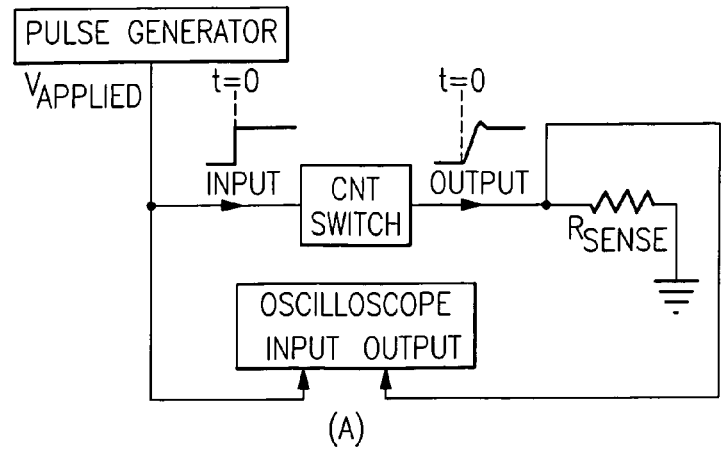
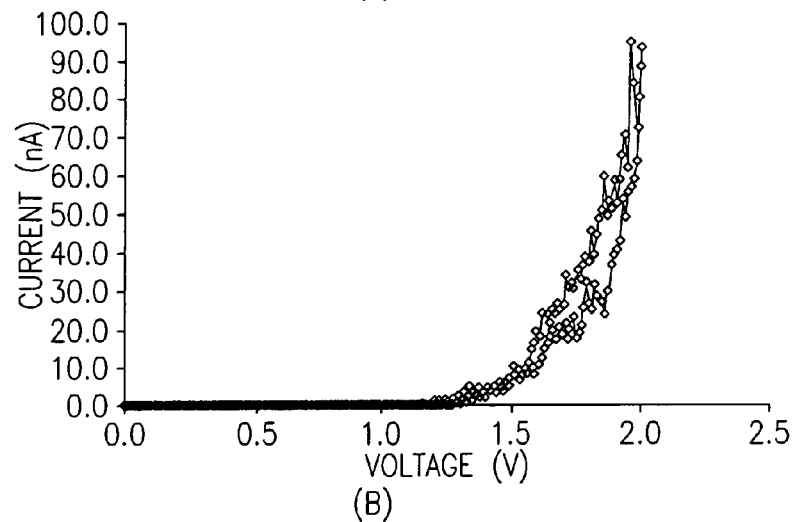
FIG.7
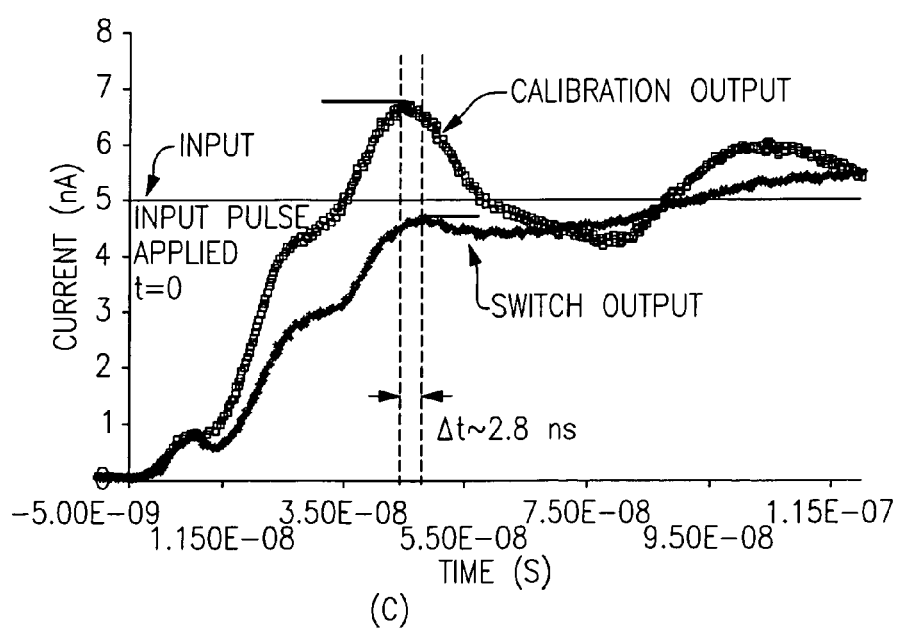

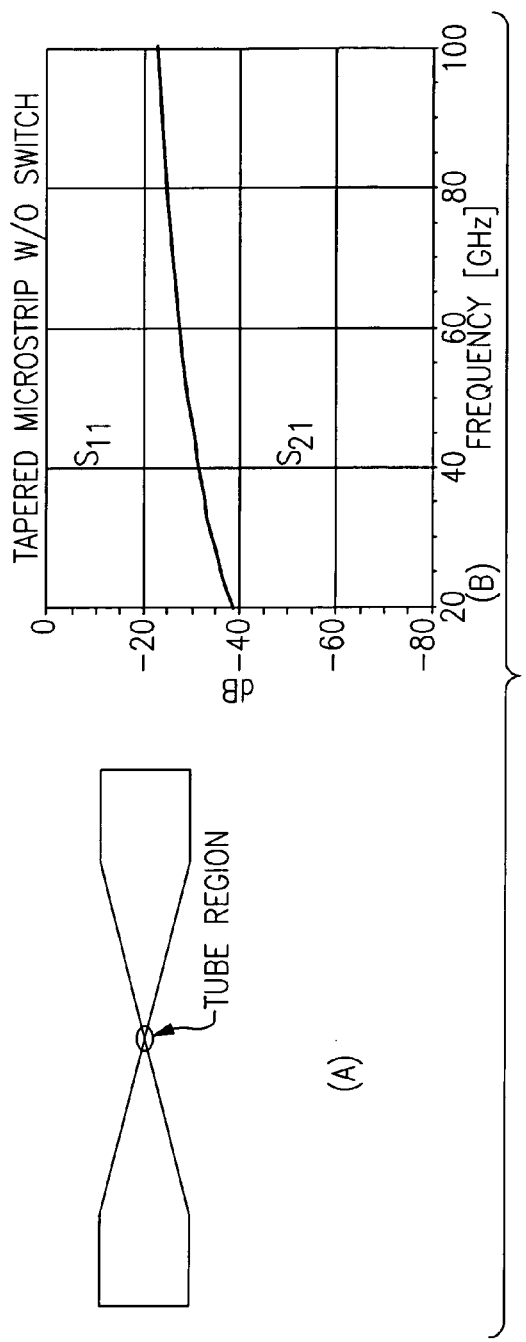
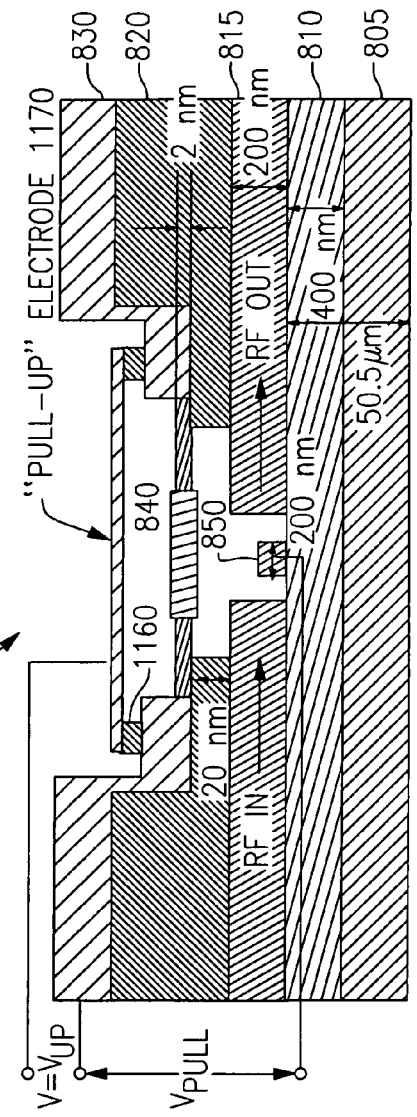
FIG. 10
FIG. 11

(A)  (B)  (C)

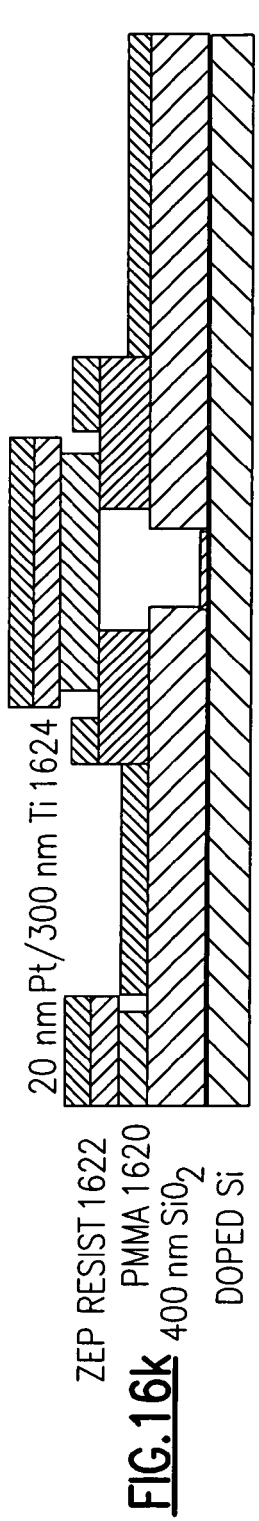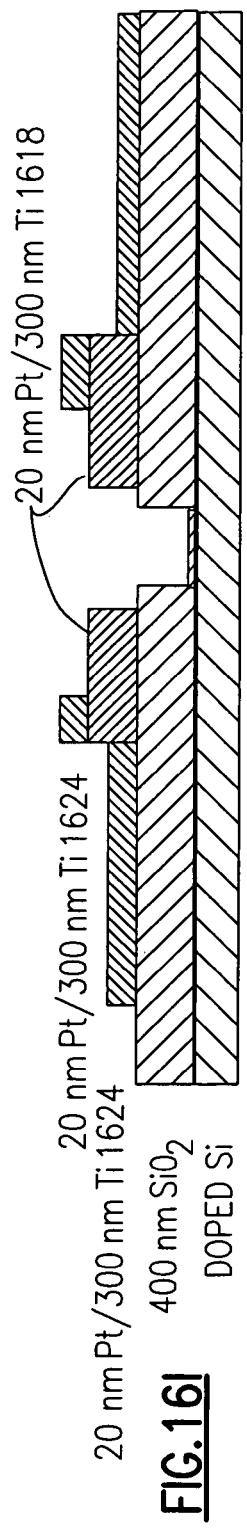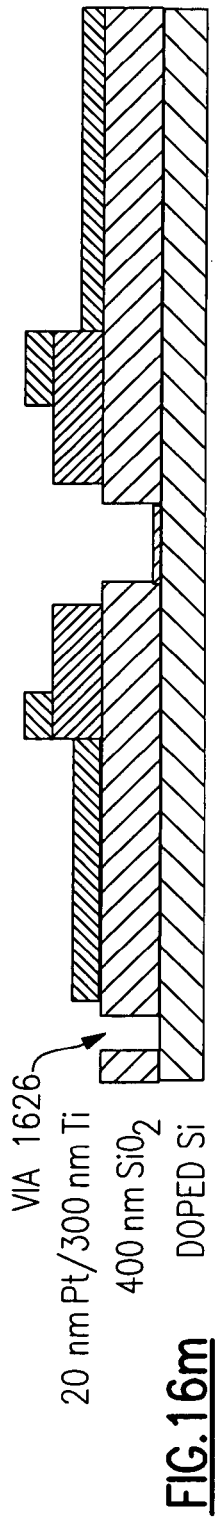
FIG.16k
FIG.16l
FIG.16m

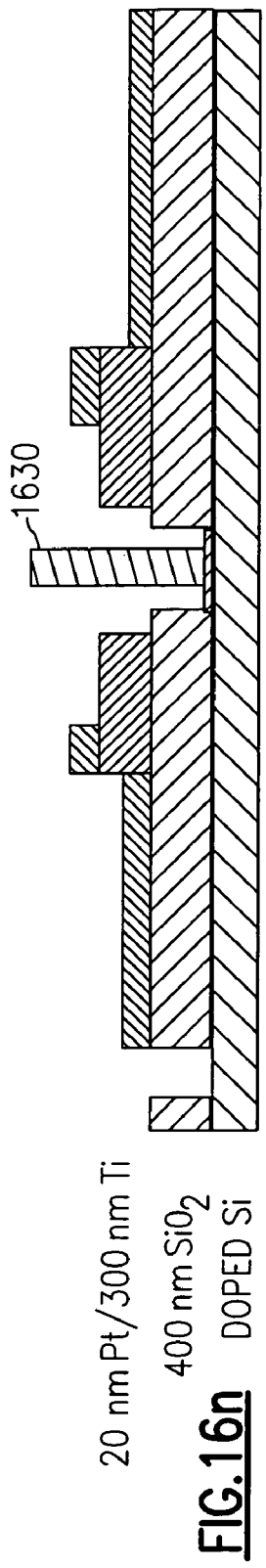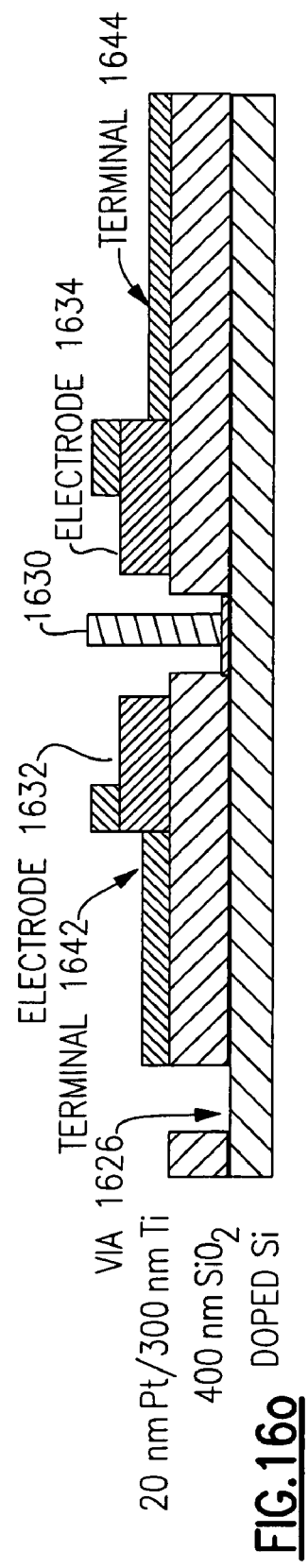

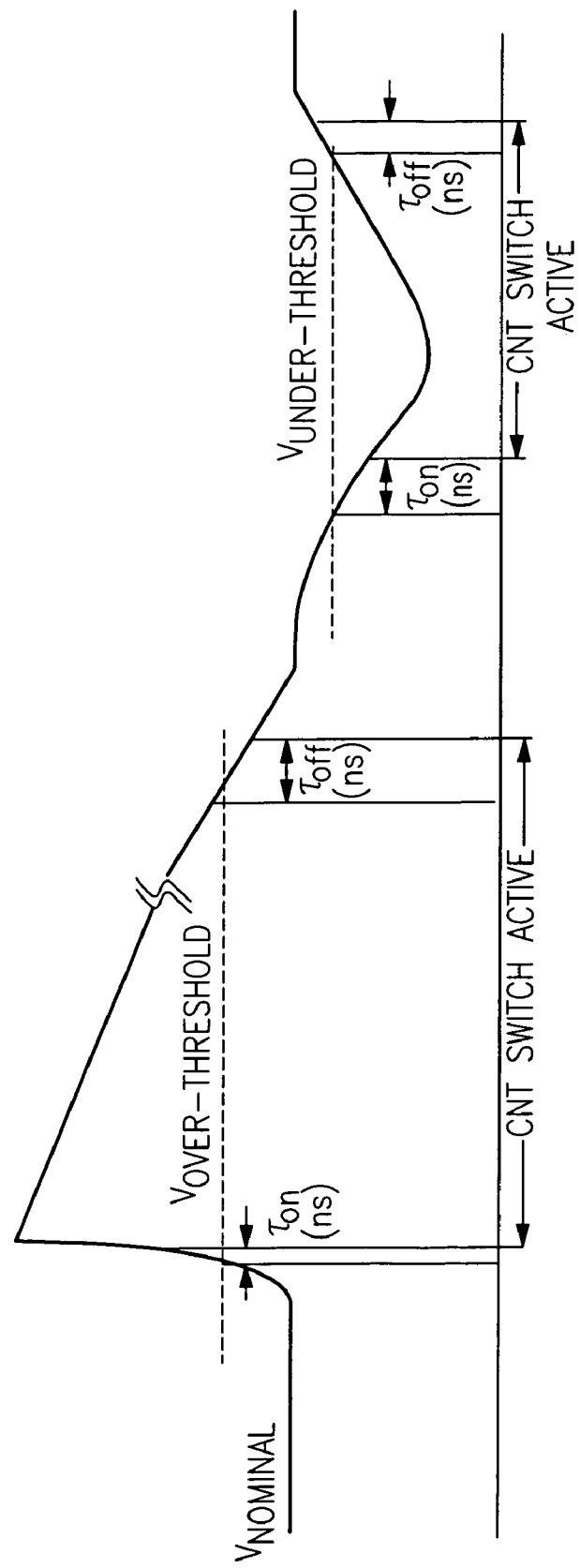

| PARAMETER | CNT SWITCH (EXPECTED) | BENCHMARK: MEMS | CNT SWITCH (MEASURED) |
|---|---|---|---|
| ACTIVATION VOLTAGE | <10 V (BATTERY OPERABLE) | 30-80 V (REQUIRES HIGH-VOLTAGE DRIVE CHIP) | 1-5 V (> 10 X) |
| SWITCHING SPEED | < 1 ns | > 1 μS | ~ 2 - 3 ns (100 - 1000 X) |
| PROCESSABILITY | COMPATIBLE WITH Si PROCESSING HIGH-DENSITY INTEGRATION, FOOTPRINT < 1 ns | STRUCTURES ARE LARGE FOOTPRINT > $10^3$ μm$^2$ | |
| POWER CONSUMPTION | FEW HUNDRED nW | FEW μW | ~ 500 nW (> 2 X) |
| CYCLABILITY | CYCLABILITY TO LONG LIFE | FATIGUE RELATED FAILURE; THERMALLY INDUCED STRESS, e.g., IN BIMORPH STRUCTURES | TENS OF CYCLES DEMONSTRATED, LONG TERM CYCLABILITY TBD |

FIG. 24

CARBON NANOTUBE SWITCHES FOR MEMORY, RF COMMUNICATIONS AND SENSING APPLICATIONS, AND METHODS OF MAKING THE SAME

CROSS-REFERENCE TO RELATED APPLICATIONS

This application claims priority to and the benefit of U.S. provisional patent application Ser. No. 60/718,585 filed Sep. 19, 2005, and of U.S. provisional patent application Ser. No. 60/797,735 filed May 3, 2006, each of which applications is incorporated herein by reference in its entirety.

STATEMENT REGARDING FEDERALLY FUNDED RESEARCH OR DEVELOPMENT

The invention described herein was made in the performance of work under NASA contract NAS7-1407, and is subject to the provisions of Public Law 96-517 (35 U.S.C. §202) in which the Contractor has elected to retain title.

FIELD OF THE INVENTION

The invention relates to high speed switching technology in general and particularly to high speed switching devices that include a carbon nanotube grown in-situ.

BACKGROUND OF THE INVENTION

Solid-State Switches

Various solid-state switches, such as PIN diodes and FETs, are known in the art. Such switches often have as limitations slow switch speeds (i.e., switching speed in the GHz range), low isolation in the OFF state (for example, less than 10 dB at 10 GHz), high insertion loss in the ON state (for example, greater than 1 dB at 10 GHz), a large footprint (for example, several $mm^2$), a requirement for high power to operate the switch, the ability to perform switching only as binary state switching devices (e.g., "on" or "off" representing only two states such as "0" and "1"), and the possibility of accomplishing multi-throw switching by staggering an array of binary switches. In fact, such a multi-throw switching capability comes at the cost of increasing the on-chip real-estate and is counter to current trends in the electronics industry towards ultimate miniaturization.

MEMS Switches

Microelectromechanical system (hereinafter "MEMS") switches are also known in the art. MEMS switch speeds have been reported to be in the range of approximately 10 to 100 μsec, but can be as low as 1 μsec with increased actuation voltage applied to the switch. Relative to solid state switches, MEMS switches can offer improved isolation, improved insertion loss, smaller size (such as a 1000 $\mu m^2$ footprint), and lower power dissipation (for example, a few μW). However, it is common that MEMS switches require high actuation voltages (for example, approximately 30V to 80V), and can be operated only by using high-voltage drive chips. In addition, conventional MEMS switches appear to have a cyclability problem, which may be associated with fatigue-related failure, for example caused by thermally induced stress in bimporph structures. The same problem with multi-throw switching that was described for solid state switches applies equally to MEMS switches.

NEMS Switches

Nanoelectromechanical system (hereinafter "NEMS") switches are also known in the art. NEMS switches depend in part on the material properties of carbon nanotubes (hereinafter "CNT" or "CNTs"). CNTs have very interesting properties because of their chemical composition (based on pure carbon), chemical bonding and mechanical structure. CNTs can be used in conventional NEMS switches by taking advantage of such properties as ultra-low low mass, high directional stiffness (for example, an elastic modulus of approximately 1 TPa), high inductance (16 nH/μm), low capacitance, and the ability to operate using electrostatic actuation. Conventional NEMS switches can produce ultra-high switch speeds, high isolation, low insertion loss, ultra-small size, ultra-low power dissipation, low actuation voltages, and long cyclability. In addition, nanotube-based NEMS have been demonstrated in applications involving nanotweezers, memory devices, supersensitive sensors, and tunable oscillators. Nanorelays are another promising application of nanotubes that offer the potential for high-performance switching, with high-speed operation at low actuation voltages and power.

Electromechanical switching in CNTs was first observed in devices in which single-walled nanotubes (hereinafter "SWNT" or "SWNTs") were mechanically manipulated to form crossed nanotubes with an air gap (that is, a crossed orientation of nanotubes that form a point contact when brought together). Others have demonstrated switching in deposited multiwalled nanotube (hereinafter "MWNT" or "MWNTs") cantilever structures, which were fabricated using an AC electrophoresis technique. Still others have also observed switching in devices using deposited MWNTs, where the individual tubes were located by SEM for subsequent e-beam and thin-film processing. Still others have demonstrated switching in deposited MWNTs cantilever devices using a technique that allows the air gap to be controlled to within 1 nm precision. Switching in both SWNTs and MWNTs has been reported for the case of deposited tubes. Nanotubes have previously been grown or deposited across trenches on a Si wafer, or been spun across the trenches at room temperature.

There is a need for switching systems that can provide the high speed operation associated with NEMS switches, with the added operational capabilities of operating at elevated temperatures and of providing convenient multi-throw (or multi-state memory) operation.

SUMMARY OF THE INVENTION

In one aspect, the invention relates to a method for manufacturing a nanoelectromechanical (NEM) switch. The method comprises the steps of providing a conductive substrate; and growing in-situ at least one carbon nanotube (CNT), the at least one CNT at least mechanically connected to the conductive substrate.

In one embodiment, the step of growing in-situ at least one carbon nanotube (CNT) is performed as a step in a sequence that comprises the additional steps of providing a dielectric material on the conductive substrate; creating a trench in the dielectric material, the trench having first and second walls extending down to the conductive substrate; depositing a refractory metal onto the conductive substrate within the trench, the refractory metal forming a first pull electrode; depositing a catalyst on a surface supported by the dielectric material for in-situ growth of at least one carbon nanotube (CNT) across the trench, placing the switch in a chemical vapor deposition (CVD) furnace for the in-situ growth; growing the at least one CNT that crosses the trench; and after the growth of the at least one CNT, depositing first and second contact electrodes on the opposite ends of the trench to contact the CNT.

In one embodiment, the method further comprises the step of metallizing a portion of the at least one CNT that is disposed between the first and the second walls of the trench.

In one embodiment, the method further comprises the steps of depositing a dielectric material onto the first and second contact electrodes; and providing a second pull electrode between the dielectric material deposited onto the first and second metal electrodes, the second pull electrode being disposed on a different side of the at least one CNT from the first pull electrode. In one embodiment, the conductive substrate is a wafer that comprises silicon.

In one embodiment, the step of growing in-situ at least one carbon nanotube (CNT) is performed as a step in a sequence the comprises the additional steps of defining on a surface of the conductive substrate a location for growing at least one carbon nanotube (CNT); depositing at the location for growing at least one carbon nanotube (CNT) a growth catalyst; defining a first plurality of locations on the conductive substrate for a first plurality of pull electrodes, the first plurality of pull electrodes when present defining a cavity therebetween; depositing a first plurality of pull electrodes, each at one of the first plurality of locations on the conductive substrate, each pull electrode electrically isolated from the conductive substrate; and growing at least one CNT at the defined location for growing the CNT.

In one embodiment, the method further comprises the steps of depositing a dielectric material onto at least some of the first plurality of pull electrodes; depositing a second plurality of contact electrodes, each contact electrode being deposited onto a respective one of the dielectric material deposited onto each of the first plurality of pull electrodes; and providing a second plurality of external terminals, each external terminal electrically connected to a respective one of the second plurality of contact electrodes. In one embodiment, the conductive substrate comprises silicon. In one embodiment, the refractory metal is a selected one of Nb, Mo and Ta. In one embodiment, any of the steps of depositing a dielectric material comprises deposition by plasma enhanced chemical vapor deposition. In one embodiment, the growth of the CNT is performed at a temperature above 500° C. In one embodiment, the growth of the CNT is performed at a temperature at or above 700° C. In one embodiment, the growth of the CNT is performed at a temperature at or above 850° C. In one embodiment, the growth of the CNT is performed at a temperature at or above 950° C.

In another aspect, the invention features a nanoelectromechanical (NEM) switch. The NEM switch comprises a conductive substrate; and at least one carbon nanotube (CNT), the at least one CNT grown in-situ and at least mechanically connected to the conductive substrate.

In one embodiment, the NEM switch comprises in addition to the conductive substrate and the at least one carbon nanotube (CNT) the following elements: a dielectric material on the conductive substrate, the dielectric material defining a trench, the trench having first and second walls; a refractory metal deposited onto the conductive substrate, the refractory metal situated within the trench and forming a first pull electrode; the CNT grown across the trench in-situ in a chemical vapor deposition (CVD) furnace; and a first contact electrode and a second contact electrode located on the opposite ends of the trench contacting the CNT.

In one embodiment, the NEM switch further comprises a plurality of external terminals, each external terminal electrically connected to a respective one of the conductive substrate and the pull electrode. In one embodiment, a portion of the CNT situated between the first and second walls of the trench is metallized.

In one embodiment, the NEM switch further comprises a dielectric material deposited onto the first and second contact electrodes; and a second pull electrode between the dielectric material deposited onto the first and second contact electrodes, the second pull electrode being disposed on a different side of the CNT from the first pull electrode.

In one embodiment, the NEM switch further comprises a plurality of external terminals, each external terminal electrically connected to a respective one of the conductive substrate and the plurality of pull electrodes.

In one embodiment, the NEM switch further comprises a first plurality of pull electrodes deposited on the conductive substrate, each pull electrode electrically isolated from the conductive substrate, the first plurality of pull electrodes defining a cavity therebetween; the CNT located within the cavity defined by the first plurality of pull electrodes and extending perpendicularly to the conductive substrate, the CNT having been grown in-situ in a chemical vapor deposition (CVD) furnace substantially directly onto the conductive substrate; and a plurality of external terminals, each external terminal electrically connected to a respective one of the conductive substrate and the first plurality of pull electrodes.

In one embodiment, the NEM switch further comprises a dielectric material deposited onto each of the first plurality of pull electrodes; a second plurality of contact electrodes, each contact electrode deposited onto a respective one of the dielectric material deposited onto each of the first plurality of pull electrodes; and a plurality of external terminals, each external terminal electrically connected to a respective one of the second plurality of contact electrodes.

In one embodiment, the plurality of pull electrodes comprises two pull electrodes located substantially diametrically opposed to each other. In one embodiment, the plurality of pull electrodes comprises three or more pull electrodes located in a substantially circular pattern. In one embodiment, the NEM switch has a unique state associated with each of the plurality of pull electrodes. In one embodiment, the NEM switch is configured as a memory having a unique state associated with each of the plurality of pull electrodes. In one embodiment, the NEM switch is configured as a computation device having a unique state associated with each of the plurality of pull electrodes. In one embodiment, the NEM switch is configured as multiplexer having a unique signal path associated with each of the plurality of pull electrodes. In one embodiment, the conductive substrate comprises a selected one of a doped silicon wafer and a silicon-on-insulator (SOI) wafer.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIG. 7a is a diagram showing a measurement circuit that was used to make switch speed measurements on the CNT air-bridge devices.

FIG. 7b is a diagram that illustrates an I-V characteristic of a candidate device that was selected for switch speed measurements.

FIG. 7c is a diagram that illustrates the output waveforms for a candidate switch and for a calibration circuit.

FIG. 8a is a schematic cross sectional diagram illustrating an alternative embodiment of the switch of FIG. 4 in the OFF state.

FIG. 8b is a schematic cross sectional diagram illustrating the switch of FIG. 8a in the ON state.

FIG. 8c is a schematic diagram showing an equivalent circuit of the switch shown in FIG. 8a.

FIGS. 9a, 9b and 9c are diagrams showing results of a simulation of the frequency dependence of the OFF-state isolation and the ON-state transmission characteristics of a CNT switch of FIG. 8a.

FIG. 10a is a diagram showing in plan a structure of tapered microstrip lines that contact the CNT switch of FIG. 8b in the ON state.

FIG. 10b is a diagram showing the calculated isolation that is determined without the tube in the circuit.

FIG. 11 is a drawing that illustrates an alternative design of a stiction tolerant RF switch.

FIG. 23 is a schematic diagram showing an exemplary use of CNT switches of FIG. 1 or FIG. 4 constructed according to principles of the invention as an ESD or overvoltage/undervoltage sensor.

FIG. 24 compares some of the expected and observed characteristics of CNT switches with MEMS switches.

DETAILED DESCRIPTION OF THE INVENTION

Figure 1:
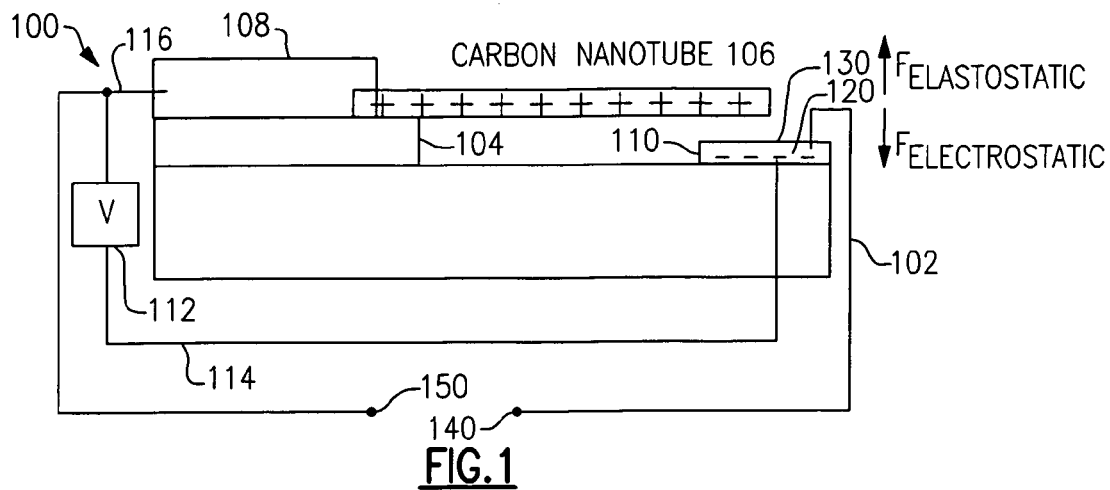
FIG. 1 is a schematic cross sectional diagram illustrating a CNT switch having a cantilevered CNT held at one end.

CNT switches that embody principles of the present invention provide many advantages as compared to conventional CNT switches or conventional NEMS switches. One set of advantages relates to the features of the CNT switches that permit them to be manufactured using materials compatible with high temperature CVD synthesis of CNTs (e.g. refractory metals such as Nb used as an actuating electrode, the use of PECVD $SiO_2$, and as necessary or desirable, the use of other refractory materials such as W, Mo, NbC, and TiN as materials of construction). Since the materials are compatible with high temperature synthesis, the CNT switch can operate as a switch, a memory, and/or a logic element in extreme environments (for example, high temperature environments, harsh chemical environments (due to chemical stability of CNT), and/or high radiation environments) and can be operated at high speed for long periods of time without concern for the potential of generating high temperatures as a consequence of power dissipation in operating the device itself, or in other operational elements in the vicinity of the CNT switch.

According to principles of the invention, the CNTs are grown on-chip ("in-situ") with patterned catalysts using materials that are compatible with the high temperature CVD synthesis of SWNTs. In one embodiment, the CNTs bridge (or are grown across) prefabricated trenches on a Si wafer, and have present a refractory metal electrode. Previously described switches are known that employ ribbons of previously prepared CNTs that can be purchased in bulk from commercial sources. Rather than using such previously prepared ribbons of CNTs, in the presently disclosed methods and systems, a location of the single CNTs grown in situ can be controlled with predefined catalysts, allowing growth using an oxide barrier (e.g. $Al_2O_3$) to achieve direct growth on conductive materials. As is described hereinbelow, the use of single CNTs can provide switching speeds much faster than ribbons of CNTs (for example, greater than 1 THz for SWNTs and hundreds of GHz for MWNTs).

General Discussion of CNT Switches

We now present a general overview of the features and advantages that can be obtained using CNT switches that embody various principals of the invention. The CNT switches can provide, in various embodiments, such features as ultra-high switch speeds (that is, switch speeds of 1 GHz or faster, or equivalently, switching times of less than 1 nanosecond). These high switch speeds allow the CNT switches to be used for the receipt and transmission of data at high speeds, and allow the CNT switches to be used for RF switching applications. The CNT switches described herein provide high electrical isolation, for example greater than 20 dB up to 100 GHz. The CNT switches described herein provide low insertion loss, for example less than 0.5 dB up to 100 GHz. The CNT switches described herein provide ultra-small size, for example a 3 μm² footprint. The CNT switches described herein provide ultra-low power dissipation, for example power dissipation in the range of a few hundred nW. The CNT switches described herein provide low actuation voltages, for example less than 10V. The CNT switches described herein provide nanometer scale beam dimensions (that is the CNT acting as a beam element, for example as a cantilevered beam, has nanometer scale dimensions). The CNT switches described herein provide operation at low power that can be driven by (or provided by) a battery or an alternative source such as a solar cell array. The CNT switches described herein provide cyclability and long life (that is, the expectation that they will operate for very many cycles without failure over an extended period of time). The CNT switches described herein are radiation tolerant, and do not require shielding from radiation sources, such as high energy particles or cosmic rays. The CNT switches described herein provide operation at high temperatures. The CNT switches described herein provide multiple-throw CNT switches that allow switching between layers and also enables switching between multiple throws in one single device. See Table I which compares some of the observed characteristics of CNT switches with several kinds of solid state memory devices, and Table II (see FIG. 24) which compares some of the expected and observed characteristics of CNT switches with MEMS switches.

In various embodiments, the CNT switches described herein are expected to be useful in applications such as satellite communications systems, including in transceivers to route signals to appropriate filters and antennas optimized for the frequency band of interest, in low noise receiver phase shifters and antenna tuners, and in phased array antenna apertures. In additional embodiments, the CNT switches described herein are expected to be useful in various portable wireless systems (for example, cell phones), in computers (for example in memory and/or in processors), and as fast-acting electrostatic discharge ("ESD") or under/over-voltage sensors.

TABLE I

| Figure of Merit | Type | | | |
|---|---|---|---|---|
| | SRAM | DRAM | Flash | 3D CNT switch (potential) |
| Switching Speed | Very high (~ns) ✓ | High (few ns - 10's ns) | Low (>μs) | Very High (~ns) ✓ |
| Power | High (<few W) | Medium (<100's mW) | Very Low (<1 μW) ✓ | Very Low (<1 μW) ✓ |
| Cost | High | Very Low ✓ | Low | Very Low ✓ |
| Non-volatile | No | No | Yes ✓ | Yes ✓ |
| Cell-size | Large (~6 Transistors) | Small (1 Transistor) ✓ | Large (>few Transistors) | Very Small (<0.25 CNTs, for 4 contacts) ✓ |
| Write-cycle lifetime | High (~$10^{15}$ cycles) ✓ | High (~$10^{15}$ cycles) ✓ | Low (~$10^{4}$ cycles) | High (~$10^{15}$ cycles) ✓ |

General Description of a CNT Switch and its Operation

FIG. 1 is a schematic cross sectional diagram illustrating a CNT switch 100 having a cantilevered CNT 106 held at one end. In one embodiment, the CNT switch is made using a substrate 102, which can be any convenient substrate, but in many instances is a silicon wafer. An insulating support layer 104 is provided adjacent a surface of the substrate 102. A CNT 106 is provided with one end connected to the substrate 102 via the support 104, and one end free (or unconnected to any structure in a permanent fashion). Because the support 104 has a thickness, the CNT 106 is mechanically separated from the substrate 102 and in the embodiment shown, is positioned so that an axial length of the CNT is substantially parallel to the surface of the substrate 102. At the end of the CNT that is connected to the substrate 102 via the support 104, a portion of the CNT may be contacted with a conductive material 108 to provide a convenient terminal for the attachment of an electrical conductor, such as wire 116. At a location on the surface of the substrate 102 proximate to the free end of the CNT, an electrically conductive contact 110 is provided, which contact 110 is connected by a wire 114 to a power supply 112 providing a voltage V. The electrically conductive contact 110 can have an insulator 120 disposed upon it, and a second contact 130 disposed upon the insulator 120. When the power supply 112 is connected to the wire 116, a voltage V appears between the free end of the CNT 106 and the contact 110. The voltage V causes charges to be induced on the CNT 106 and the contact 110 (as shown by the "+" and "−" signs in FIG. 1, causing an electrostatic force to appear between the free end of the CNT 106 and the contact 110, as shown by the arrow labeled $F_{electrostatic}$. As the free end of the CNT 106 is caused to be displaced toward the contact 110, a mechanical force, as shown by the arrow labeled $F_{elastostatic}$, appears in the CNT 106 and opposes the electrostatic force. Depending on the magnitude of the voltage applied, the CNT may bend sufficiently to cause the free end of the CNT and the contact 110 to come together, closing the switch 100 by causing the free end of the CNT 106 to contact the second contact 130. If the voltage across, or the current flowing between, contact 130 and terminal 108 is measured, for example by testing probe terminals 140 and 150, the CNT switch can be used to provide switching and/or signal transmission.

Figure 2:
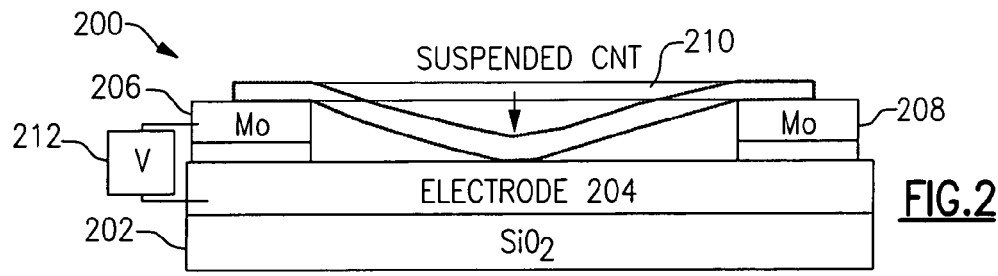
FIG. 2 is a schematic drawing in cross section that illustrates an exemplary embodiment of a CNT air-bridge switch, according to principles of the invention.

Various geometries can be implemented to realize a CNT switch, including a geometry that is referred to herein as an "air-bridge" or an "air gap" switch and a geometry that is referred to herein as a "vertical configuration" switch. While the terms "air gap" and "air bridge" are used, it should be noted that the CNT switches are expected to be operable in the absence of air (that is, under vacuum conditions), and the use of the word "air" is not to be taken as requiring operation in air per se. FIG. 2 is a schematic drawing in cross section that illustrates an exemplary embodiment of a CNT air-bridge switch. The CNT switch of FIG. 2 comprises a CNT suspended between metal contacts (for example, Mo islands) adjacent a base electrode deposited over an insulator such as $SiO_2$. The base electrode could comprise, for example, a refractory metal such as Nb, W, or Mo, or other conductive refractory materials such as NbC, TiC, NbC, SiC, or TiN. In FIG. 2, the substrate 202 is glass ($SiO_2$), upon which is provided an electrode 204. At two separated locations on the electrode 204 (or in an alternative embodiment, on the substrate 202), there are provided an insulator 206 and thereupon a metal contact 208 such as molybdenum (Mo). A CNT 210 is grown in situ between the two metal contacts 208. When a voltage V is applied by a power supply 212 that is electrically connected between the electrode 204 and at least one of the metal contacts 208, the CNT 210 is displaced toward the electrode 204, as shown by the dotted lines and the arrow, in response to the applied voltage.

Figure 3:
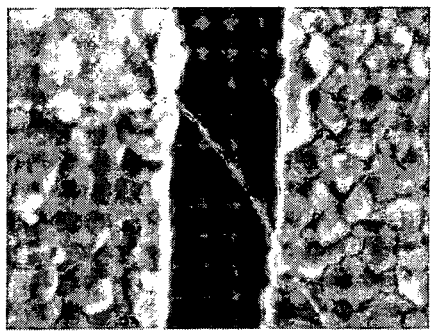
FIG. 3 is an image in plan orientation of a single CNT grown in situ across a trench between two refractory metal contacts in an air-bridge switch such as that shown in FIG. 2, according to principles of the invention.

FIG. 3 is an image in plan orientation of a single CNT grown in situ across a trench between two refractory metal contacts in an air-bridge switch such as that shown in FIG. 2. The growth of the single CNT, as well as the other steps of preparing a CNT switch, will be presented in detail hereinbelow. In FIG. 3, the single CNT is clearly visible as the thin line extending from the upper left to the lower right of the image. The trench over which the single CNT passes is the dark vertical region in the center of the image, which has a conductive electrode disposed therein. The lighter, granular objects on the right and the left sides of the image are the refractory metal contacts.

Figure 4:
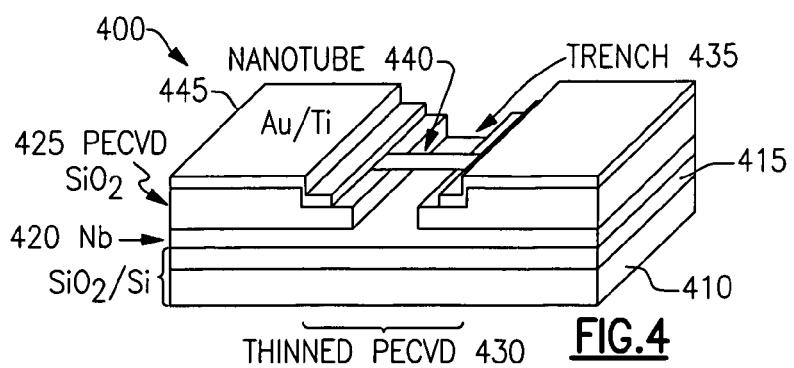
FIG. 4 is a schematic diagram in perspective showing the various layers in one embodiment of a CNT air-bridge switch, according to principles of the invention.

FIG. 4 is a schematic diagram in perspective showing the various layers in one embodiment of a CNT air-bridge switch 400. As shown in the embodiment of FIG. 4, the CNT air-bridge switch comprises a CNT 440 suspended over a refractory metal electrode 420 made of Nb. The Nb electrode serves as the pull electrode for transiently charging the CNT to induce electromechanical switching.

The CNT switch of FIG. 4 is constructed starting with a <100> silicon wafer substrate 410 that is thermally oxidized. The oxidation of the silicon produces a layer 415 of $SiO_2$ insulator on the surface of the Si wafer 410. A Nb film 420 is deposited on the oxide layer 415 by any convenient method, such as dc magnetron sputtering. Nb is a suitable choice for the pull electrode material because of its refractory nature and its chemical and structural stability at the high growth temperatures (~850° C.) required for the CVD synthesis of SWNTs. Although other refractory metals could also be considered, some of these materials, such as Ti and Ta, form volatile metal hydrides at high temperatures in a hydrogen ambient, and are preferentially etched. In the embodiment shown, the Nb layer 420 is sputter deposited to a thickness of ~200 nm.

A ~200 nm layer of PECVD $SiO_2$ 425 is then deposited to serve as a dielectric layer between metallic conductors in the switch. Using a first masking layer, active device regions in the PECVD $SiO_2$ are patterned to thin down the oxide from 200 nm to ~20 nm, which is a thickness comparable to the air gap of the switch. In the schematic diagram shown in FIG. 4, only one thinned PECVD $SiO_2$ region 430 is shown. Nanotrenches 435 that are as narrow in width as 130 nm are then defined using e-beam lithography in the region of the thinned PECVD $SiO_2$ layer 430. A trench 435 has a wall defined on each side of the trench, the walls being approximately as high as the thinned PECVD $SiO_2$ that was removed. The nanotrenches 435 are patterned using $CF_4/O_2$ reactive ion etching ("RIE") to etch the PECVD $SiO_2$ down to the Nb layer 415.

A catalyst is used to initiate and control the grown of a single CNT. In one embodiment, the catalyst is 0.5-nm-thick Fe, which is deposited by e-beam evaporation. The catalyst is deposited over an area, and is patterned by photolithography and liftoff of excess Fe. The substrate, having been prepared with patterned Fe, is then placed in a CVD furnace for nanotube growth at 850° C. for 10 min. using $CH_4$ and $H_2$ at flow rates of 1500 and 50 sccm, respectively, where SWNT growth predominates. Nanotubes 440 are thus prepared that extend from one side of the trench 435 to the other side of the trench 435.

Characterization of CNTs grown by this approach reveals nanotubes with diameters typically between 1 and 3 nm. TEM studies indicate that most of these tubes are SWNTs. After CNT growth, metal such as Au/Ti is deposited over the exposed PECVD SiO2 and over the ends of the CNTs to provide contacts or electrodes. The Au/Ti metal electrodes are patterned to contact the CNTs, using a bilayer AZ 5214/PMMA lift-off process, which results in easy lift-off of metal films because of an undercut in the PMMA layer. Additional electrode material, for making easy external connections, using metals such as Au/Ti, are then deposited in an e-beam evaporator (220 nm/12 nm) and lifted off in acetone.

Figure 5:
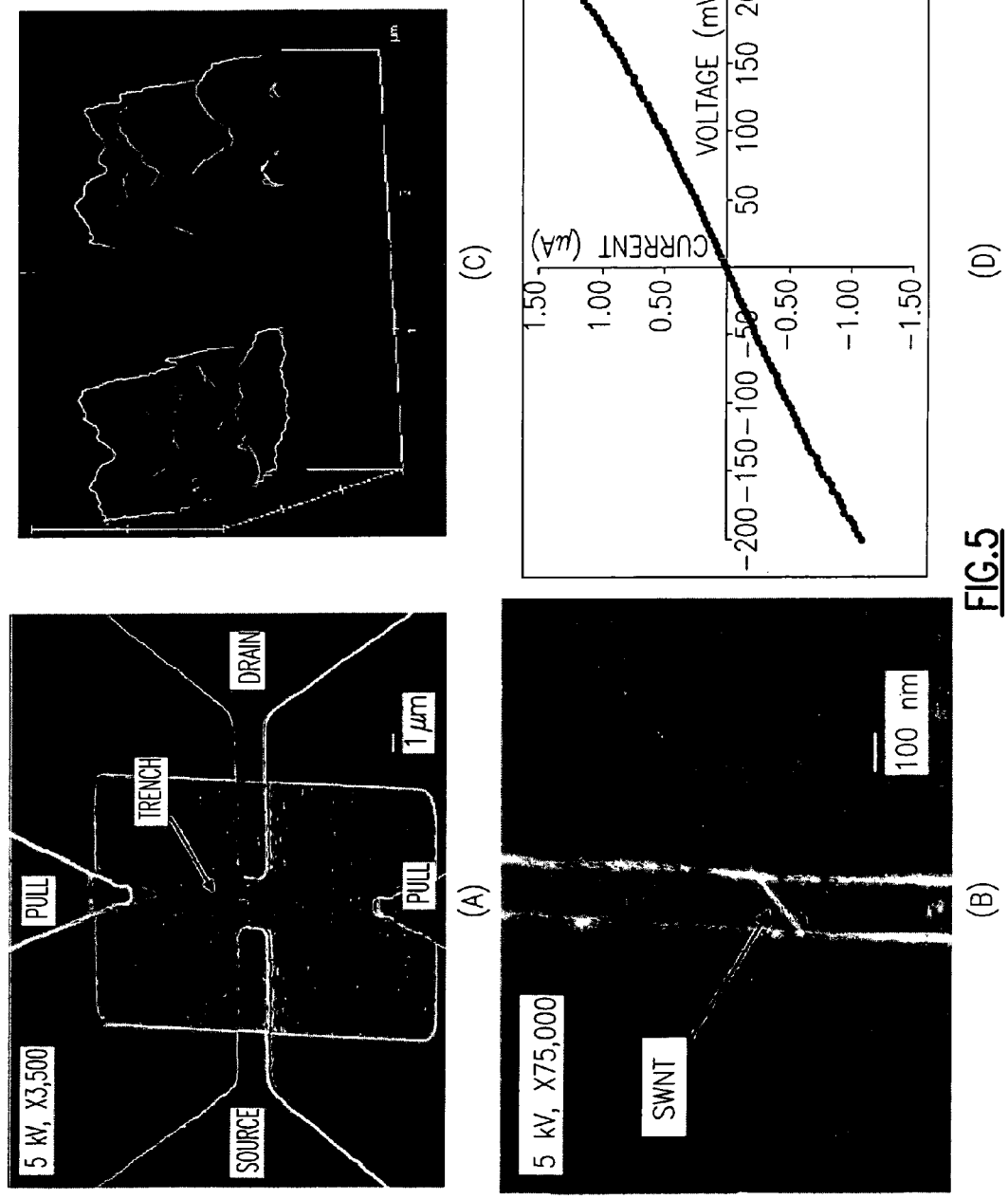
FIG. 5a is an SEM micrograph image of a finished device fabricated according to principles of the invention.
FIG. 5b is a higher-magnification SEM image that depicts a nanotube crossing a trench of a finished device fabricated according to principles of the invention.
FIG. 5c is an atomic force microscope ("AFM") image, which is a cross section of a wide-area 1 μm trench of a finished device fabricated according to principles of the invention.
FIG. 5d is a diagram showing the conductance between the source and drain electrodes of a typical air-bridge switch device fabricated according to principles of the invention.

FIG. 5a is a low magnification SEM image (made with a JEOL 6700) of a finished device. In FIG. 5a, the underlying Nb pull electrode in the nanotrench is contacted by the Au/Ti electrodes labeled "pull". In FIG. 5a the source electrode (labeled "source") and the drain electrode (labeled "drain") are also shown. The source and drain electrodes contact the CNT that bridges the trench. The trench is identified by an arrow labeled "trench."

FIG. 5b is a higher-magnification SEM image that depicts a nanotube crossing a 130 nm wide trench. FIG. 5c is an atomic force microscope ("AFM") image, which is a cross section of a wide-area 1 μm trench. The nominal trench depth is ~20 nm, but because of surface roughness in the example shown in FIG. 5c the uncertainty in trench depth is large.

FIG. 5d is a diagram showing the conductance between the source and drain electrodes of a typical air-bridge switch device. Analysis of the data presented in FIG. 5d yields a resistance of ~200 kΩ, for a trench width ~250 nm, 2 μm×5 μm catalyst area. Much of the resistance is attributed to contact resistance between the CNT and Au/Ti films. Source-todrain resistances typically range in value from tens of kilo-ohms (KΩ) to tens of mega-ohms (MΩ). It is observed that the presence of multiple tubes can also contribute to differences in the resistance.

The actuation voltages of the CNT switch can be measured by applying a dc voltage between the source and pull electrodes. As transient charge develops on the tube with increasing bias voltage, the resulting electrostatic force is sufficient to overcome the elastostatic force and deflects the suspended tube down toward the pull electrode. The current can be measured as a function of the dc bias voltage between the source and pull electrodes.

Figure 6:
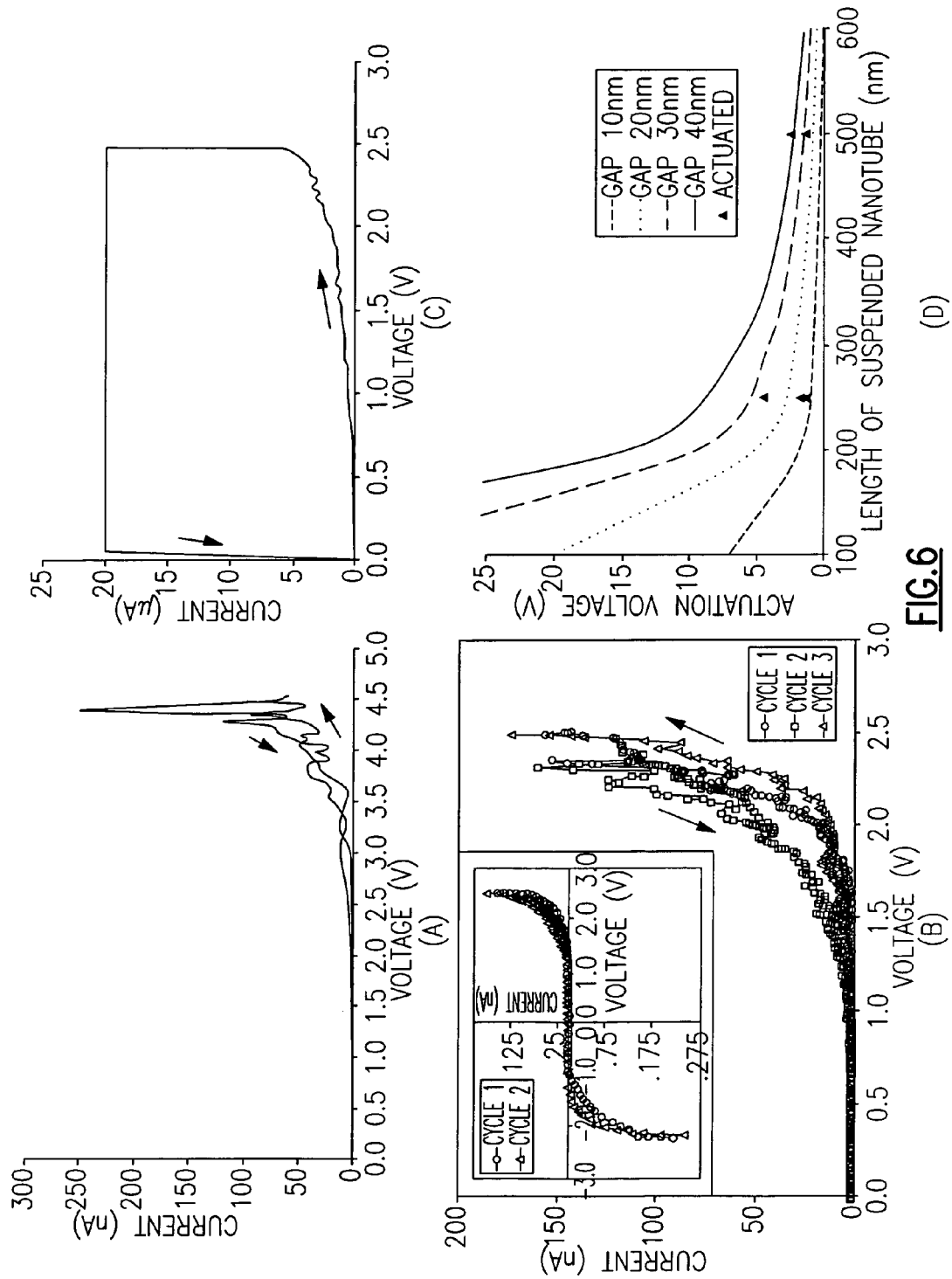
FIG. 6a is a diagram showing an I-V characteristic for the device illustrated in FIG. 5b.
FIG. 6b is a diagram showing an I-V characteristic of another device that was actuated over several cycles.
FIG. 6c is a diagram showing an I-V characteristic that illustrates the behavior of a representative example of a device exhibiting stiction.
FIG. 6d is a diagram that shows the results of calculated $V_{PI}$(SWNT) for CNT switches as a function of beam length at air gaps ranging in value from 10 to 40 nm, taking E≈1 TPa and Do≈2 nm.

FIG. 6a is a diagram showing an I-V characteristic for the device illustrated in FIG. 5b. For voltages up to 2.0 V, the currents are very low, a few pA. Then from ~3.5 V, the current begins to rise rapidly to ~250 nA at ~4.5 V. This switching between the low- and high-current states represents more than a ~4 order of magnitude increase, implying well-defined OFF and ON states, respectively. The currents measured are believed to originate from a tunneling mechanism; as the tube deflects closer to the bottom electrode with increasing bias voltage, the magnitude of the tunnel current increases exponentially. In the rapidly rising current regime, the data is increasingly noisy, reflecting the stochastic nature of the tunneling mechanism. Hysteresis between the increasing and decreasing bias voltage paths was also evident, as illustrated in FIG. 6a, and is believed to arise from the interaction of the tube with surface van der Waals forces. Lateral leakage currents within the dielectric were extremely small, ~10 pA at ±5 V, as indicated by currents in the absence of nanotubes.

FIG. 6b is a diagram showing an I-V characteristic of another device that was actuated over several cycles. Turn-on occurs at ~2.4 V in this case, with a slight variation with cycling that is also reported in other CNT and MEMS switches. The rapidly rising current regime arises in both the forward-biased (pull electrode grounded) and reverse-biased (pull electrode positive) cases, as indicated by the inset of FIG. 6b, although the exact switching voltages are slightly different in the two cases, ~2.4 V (forward-biased) and ~2.2 V (reverse-biased). The differences in turn-on voltage can perhaps arise from the random distribution of metallic and semiconducting tubes observed in current SWNT growth processes. Nevertheless, the data suggests that the differences in resistance between the ON and OFF states far outweigh any differences that may arise from contact resistances. As shown by the inset of FIG. 6b, this switching behavior is polarity-independent, as would be expected for electrostatic actuation, and rules out field emission as a likely mechanism at these voltages.

In general, the magnitude of the switching voltages in these air-bridge devices was a few volts, which is smaller by at least an order of magnitude compared to actuation voltages typically observed in MEMS switches. In cantilever CNT devices, the turn-on voltages were also somewhat higher in the 6-20 V range. The differences in device geometries, such as larger air gaps (~80 nm) and the use of MWNTs, may be sufficient to explain the larger turn-on voltages required in that case. However, others report low switching voltages of 2.8-3.0 V in their MWNT cantilever structures, a result that can be attributed to the very shallow (4 nm) air gaps.

FIG. 6c is a diagram showing an I-V characteristic that illustrates the behavior of a representative example of a device exhibiting stiction. In this case, the current rises rapidly at 2.5 V and saturates at the instrumentation compliance, which was set to ~20 μA. On the decreasing-voltage path, an ohmic resistance was observed, which was typically in the range of a few kiloohms to hundreds of kiloohms. The ohmic behavior persisted upon subsequent cycling and the device appeared stuck. Others have noted that it is possible to prevent stiction in their devices by applying a decanethiol self-assembled monolayer (SAM) coating over the Au electrode that the CNT contacts.

The operation and design of NEM switches resembles MEMS switches, and pull-in voltages can be calculated using continuum beam mechanics. When the contribution from van der Waals forces is ignored, the pull-in voltage, $V_{PI}$, to first order, is calculated using $$V_{PI} = \sqrt{\frac{8kg^3}{27\varepsilon_o wL}} \tag{1}$$

where g is the air gap, $\varepsilon_0$ is the effective permittivity, w is the beam width, and L is the length. The spring constant, k, for a doubly clamped beam is given by $$k = \frac{384EI}{L^3} \tag{2}$$

where E is the elastic modulus, and I is the moment of inertia given by $$I = \frac{\pi}{4}\left(\left(\frac{D_o}{2}\right)^4 - \left(\frac{D_i}{2}\right)^4\right) \tag{3}$$

Here Do and Di are the nanotube outer and inner diameter, respectively. In the case of SWNTs if we assume that Di=0, then $I_{SWNT}$>I, yielding $k_{SWNT}$>k. Hence, if the pull-in voltage for a SWNT device, $V_{PI}$(SWNT), is calculated, then this pull-in voltage will set an upper bound for the actuation voltage in the case where Di is nonzero. Using eqs 1-3, we have calculated $V_{PI(SWNT)}$ as a function of beam length at air gaps ranging in value from 10 to 40 nm, similar to the range of air gaps for our fabricated devices when surface roughness is also considered. The results are plotted in FIG. 6d, where we have assumed that E≈1 TPa and Do≈2 nm. The measured voltage data obtained for our fabricated air-bridge devices was mapped onto the plot, where the length of the suspended tube was assumed to be the same as the designed trench width. To first order, the pull voltages seem to fall in the window of expected voltages given the uncertainty in all of the parameters involved, such as the actual air gap, elastic modulus, and tube diameter in each device. In addition, in the situation of the random orientation of tubes during growth, the length of the suspended tube is not necessarily equal to the trench width. As described hereinbelow, progress in the electric-field-directed growth of SWNTs appears to result in more controllable nanotube architectures.

We have evaluated the potential RF performance of the CNT air-bridge switches. We began by modeling our switch connected with a 50 K co-planar waveguide (CPW) transmission line, where the ground lines contact the CNT and the signal line is coupled with the pull electrode. Finite element modeling with FEMLAB (a 3D partial differential equation simulation and analysis package, available from COMSOL, Inc., 1 New England Executive Park, Suite 350, Burlington, Mass. 01803; see http://www.comsol.com/press/pr/001001.php?highlight=FEMLAB) was used to determine the electric potential of the structure shown in FIG. 4, with a 130 nm wide trench and a 13 nm air gap between the CNT and the pull electrode, from which the quasi-static capacitance was calculated by solving the generalized Poisson's equation. From the electrostatic potential, the stray capacitance $C_{stray}$ of the structure without a CNT was determined to be ~420 aF. With the nanotube over the trench the computed capacitance $C_{tube}$ was 2.71 aF. The quantum capacitance $C_Q$ and kinetic inductances $L_K$ of the CNT were calculated based on (4) and (5) below, $$C_Q = \frac{2e^2}{hv_f} = 100 aF/\mu m \quad (4)$$

$$L_K = \frac{h}{2e^2 v_f} = 16 nH/\mu m \quad (5)$$

where h is the Planck's constant=$6.626 \times 10^{-34}$Js, $v_f$ is the Fermi velocity=$8 \times 10^5$ ms$^{-1}$; and e is the electric charge=$1.6 \times 10^{-19}$ C. The length of the tube was assumed to be 2 μm yielding values of $C_Q$=200 aF and $L_K$=32 nH for the switch. The total capacitance C is given by $$C = C_{stray} + C_{tube} + C_Q = 420 \quad aF + 2.71 \quad aF + 200 \quad aF = 622.1 \, aF \quad (6)$$

FIG. 7a is a diagram showing a measurement circuit that was used to make switch speed measurements on the CNT air-bridge devices. A step function was applied to the device using a pulse generator (Agilent 81101A). An output voltage was measured across a sense resistor (R≈110 kΩ) that was connected in series to ground. Both the input and output pulses were displayed synchronously on two channels of a digital oscilloscope (Tektronix TDS 3054), from which the delay times were determined.

A prescreening measurement was first done to select a candidate device for the switching speed measurement. FIG. 7b is a diagram that illustrates an I-V characteristic of a candidate device that was selected for switch speed measurements. In this candidate device the currents begin to rise rapidly at ~2 V. To prevent stiction in candidate devices selected for the speed measurement, the voltages used in the prescreening measurement were limited to the point where the first onset of switching was observed.

Switch speed measurements were performed for the device shown in FIG. 7b. FIG. 7c is a diagram that illustrates the output waveforms for a candidate switch and for a calibration circuit. The voltage applied by the pulse generator was incrementally increased by 200 mV intervals. No output pulse was detected for applied voltages up to 4.8 V. At ~5 V, the output voltage increased rapidly as shown in the "switch output" waveform of FIG. 7c. The "calibration output" waveform refers to the case where the device was removed and the probes were placed on a metal strip on-chip to measure the intrinsic delay associated with the instrumentation, such as that arising from cable lengths, stray capacitances, and inductances both on- and off-chip. The difference in time required to reach the maximum voltage between the two waveforms was determined to be ~2.8 ns, as indicated in FIG. 7c, yielding an upper bound of the intrinsic switching speed of the CNT switch. The oscillations in the calibration and switch waveforms likely arise from resonances associated with the lead-line inductances and the capacitances from the instrumentation; we do not have sufficient information available to calculate the nature of the damping mechanisms involved in these cases. In the switching example of FIG. 7c, the maximum voltage was attained in one switching event. When some other devices were measured, switching occurred in more than one stage, suggesting the presence of multiple tubes that switch at different voltages.

The switching times of our CNT switches are several orders of magnitude smaller as compared to state-of-the-art MEMS devices (or stated in the alternative, our CNT switches are several orders of magnitude faster switches than state-of-the-art MEMS switches). In general, for switches that rely on electromechanical actuation, the switching time is composed of the response time, which is the time required to overcome mechanical inertia, as well as the rise time of the voltage pulse due to charging capacitances. In surface-mount relays, the response time is in the millisecond range and dominates switching speed. While device dimensions and mass in MEMS switches are much smaller, the response time is still a significant fraction of the total switching time. For example, others have reported the total switching time for Si MEMS devices to be 52 μs, for which the response time alone was ~30 μs. The ultralow mass, exceptionally high spring constant, and extremely low capacitance of the CNT all contribute to the small response and rise times in the CNT switch, which lead to the extremely small total switching times, provide a detailed theoretical analysis of the switching dynamics in CNT switches with predicted times in the nanosecond range and also discuss the effect of surface dissipative forces. The fastest MEMS switch was developed at MIT Lincoln Labs and is reported to have a switching time of 1 μs; this was realized by decreasing device dimensions, but there is a concomitant increase in the voltage, with 60-70 V needed for actuation. These voltages are difficult to obtain in applications where low-voltage power supplies are used, such as hand-held mobile phones and other wireless applications, as well automotive vehicles. The CNT air-bridge switch has the unique advantage of low actuation voltage, <5 V, while enabling nanosecond switching times.

Another embodiment of a CNT air-bridge switch of the present invention is shown in FIG. 8a and FIG. 8b. The CNT air-bridge switch of FIG. 8a and FIG. 8b is derived from the embodiment illustrated in FIG. 4. FIG. 8a is a schematic cross sectional diagram illustrating an alternative embodiment of the switch of FIG. 4 in the OFF state. FIG. 8b is a schematic cross sectional diagram illustrating the switch of FIG. 8a in the ON state.

While the CNT air-bridge switch of FIG. 4 provides insertion losses of 0.5 dB up to 100 GHz, the isolation is not satisfactory for RF applications. It is believed that the RF performance of the CNT air-bridge switch of FIG. 4 stems from the high tube inductance of 16 nH/um which dominates RF performance. The alternative embodiment of FIG. 8a and FIG. 8b uses nanotube inductance in such a way that RF performance is actually enhanced.

In FIG. 8a and FIG. 8b, only the elements on the right half of the switch are identified with numerals, because the left half of the diagrams are mirror images of the right half, other than the connections of the applied voltage V (which are only shown on the left half of the drawings). The structure of the RF CNT air-bridge switch 800 is shown in FIG. 8a and FIG. 8b where the CNT is suspended in shallow trenches in a PECVD $SiO_2$ layer over a Nb ground plane. In this embodiment, a silicon substrate 805 is provided upon which an insulting thermal $SiO_2$ layer 810 is grown. Conductive layers 815 are provided upon the insulting thermal $SiO_2$ layer 810, so that an RF signal can be introduced to and removed from the CNT switch 800 when the switch is closed. A channel, for example a 400 nm wide channel, is opened in the conductive layer 815 to provide a location for a pull electrode 850. The channel serves to segment the conductive layers 815 into two electrically disconnected segments. The pull electrode 850 is electrically separated from the conductive layers 815, and is thinner than the conductive layers 815. An insulator 820, such as PECVD $SiO_2$, is deposited upon the conductive layer 815. A region of the insulator 820 is thinned to a thickness of the order of 20 nm over a width somewhat wider that the channel provided for the pull electrode 850. The thinned PECVD $SiO_2$ is opened to allow contact to be made with the conductive layers 815. A CNT 840 is grown across the opening in the thinned PECVD $SiO_2$. In some embodiments, a portion of the CNT 840 that is situated within the width of the opening in the thinned PECVD $SiO_2$ is metallized. In some embodiments, the CNT 840 can be metallized using electroplating. In some embodiments, the CNT 840 is not metallized. Contacts 830 comprising electrically conductive material for the ends of the CNT are provided. In operation, when no voltage is applied between at least one of the contacts 830 and the pull electrode 850 the switch 800 is open, as shown in FIG. 8*a*. When a voltage Vpull is applied between at least one of the contacts 830 and the pull electrode 850, there is generated a displacement force ($F_{electrostatic}$ of FIG. 1) that causes the CNT to be displaced, so that the metallized portion of the CNT comes into contact with the two sections of the conductive layers 815, thereby creating a conductive path from one conductive layer segment to the other conductive layer segment, and a signal such as an RF signal can pass across the switch.

FIG. 8*c* is a schematic diagram showing an equivalent circuit of the switch shown in FIG. 8*a*. From the equivalent circuit, the swept frequency response was simulated up to 100 GHz using Ansoft Designer available from the Ansoft Corporation, having a place of business at 225 West Station Square Drive, Suite 200, Pittsburgh, Pa. 15219.

Figure 8:
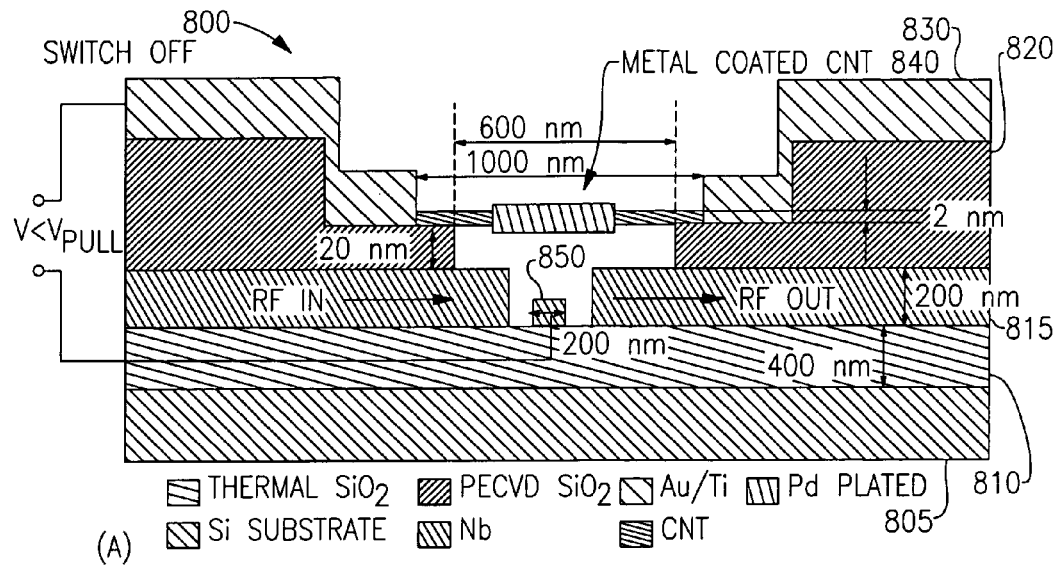
Figure 8:
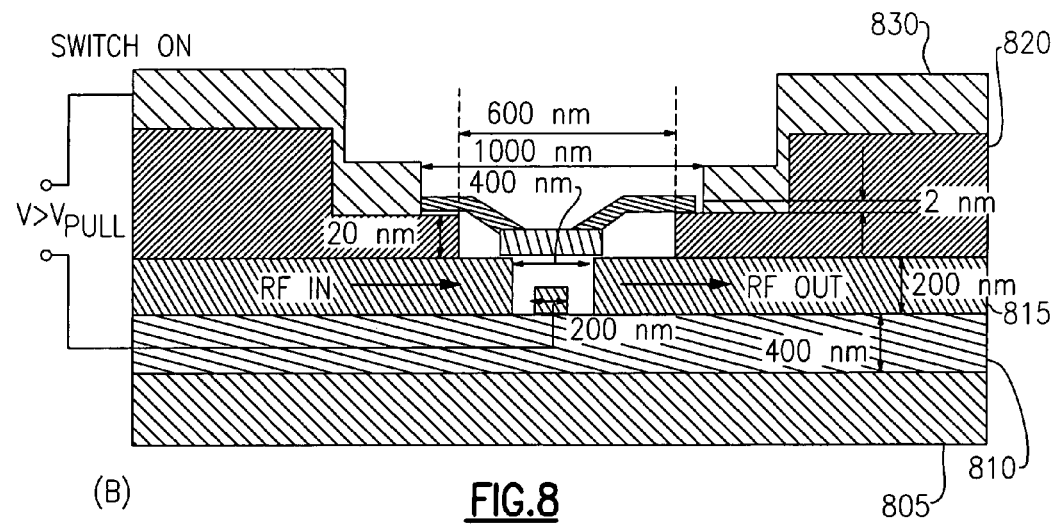
Figure 8:
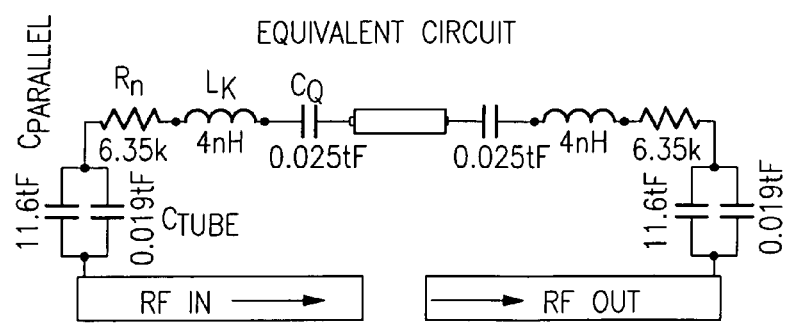
Figure 9B:
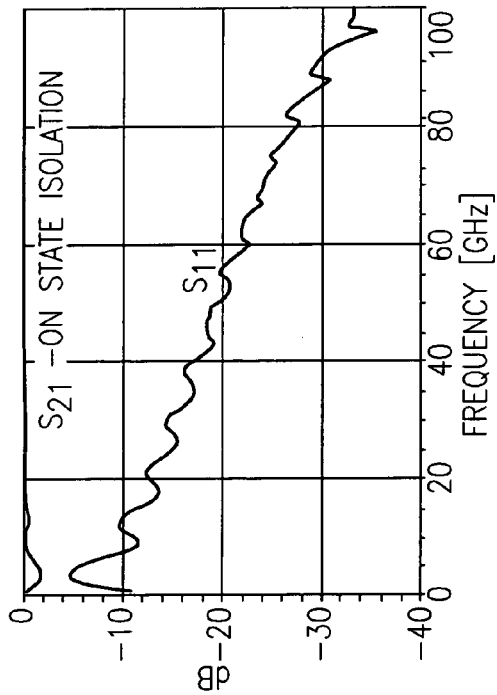
Figure 9A:
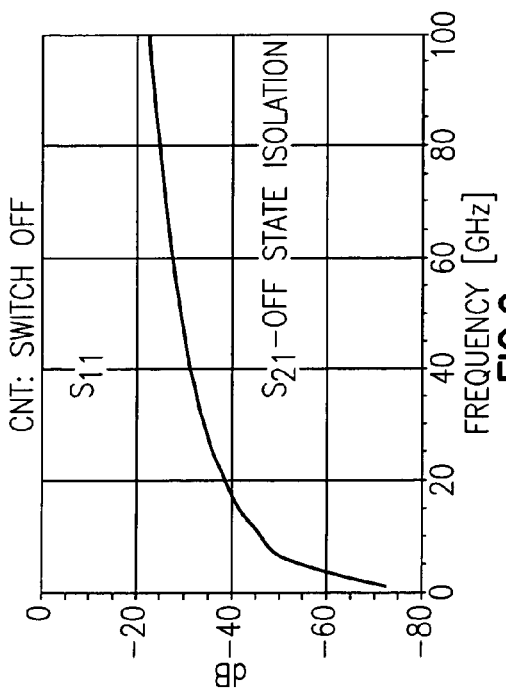
Figure 9C:
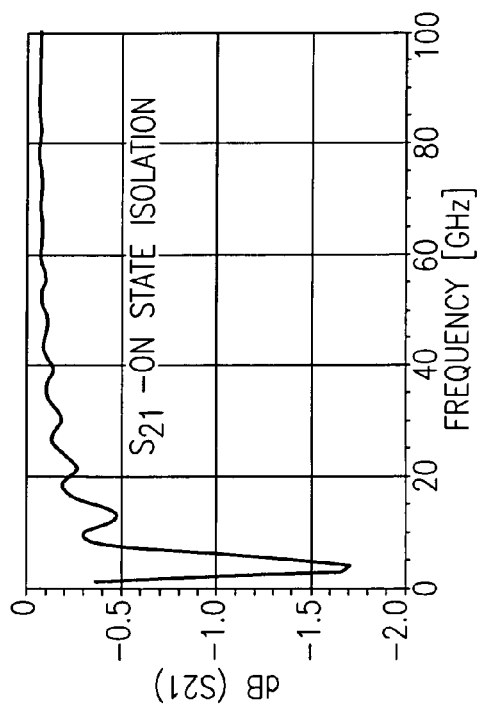

FIGS. 9*a*, 9*b* and 9*c* are diagrams showing results of a simulation of the frequency dependence of the OFF-state isolation and the ON-state transmission characteristics of a CNT switch of FIG. 8*a*. In the OFF state with no DC bias applied, the high tube inductance prevents any parasitic coupling between the RF lines and the tube, resulting in isolation as high as 20 dB up to 100 GHz, as shown in FIG. 9*a*. As the DC bias voltage is increased and approaches the pull voltage, the CNT is bent and moves closer to the RF lines. At voltages>Vpull, the metallized portion of the tube is in physical contact with the RF microstrip transmission lines, which results in a metal-metal contact allowing transmission of the RF signals. The insertion loss in this ON state is determined to be less than 0.5 dB up to 100 GHz, as indicated in FIG. 9*b* which also shows the return loss. Shown in FIG. 9*c* is the insertion loss on an expanded scale.

Even if silicon MEMS switches could be formed using elaborate processes with e-beam lithography, the inherent materials properties of Si at these nanometer scale dimensions would result in too many parasitic losses arising, which would lead to poor isolation. This is unlike the nanotube switch, where the tube inductance reduces any parasitic coupling. This can be further elucidated as shown in FIG. 10.

FIG. 10*a* is a diagram showing in plan a structure of tapered microstrip lines that contact the CNT of the switch of FIG. 8*b* in the ON state. FIG. 10*b* is a diagram showing the calculated isolation that is determined without the tube in the circuit. FIG. 10*b* shows that the isolation is larger than 20 dB at 100 GHz. Since there is no noticeable difference between the plot in FIG. 9*a* and FIG. 10*b*, we conclude the high tube inductance prevents any RF leakage in the OFF state.

After the CNT air-bridge switch has switched ON to the down state, it needs to return back to the OFF state. Upon removal of the DC bias, the tension or the elastostatic force on the CNT will spring it back to the OFF state. However, van der Waals forces—which are believed to dominate at these nanometer scale dimensions—may cause the tubes to remain in contact with the RF electrodes even after the bias voltage is removed. This stiction behavior may limit the performance of the CNT switch.

An alternative design of a stiction tolerant RF switch 1100 is shown in FIG. 11. All of the elements denoted with numbers beginning with the numeral 8, including substrate 805, insulting thermal $SiO_2$ layer 810, conductive layers 815, insulator layer 820, contacts 830, CNT 840, and pull electrode 850 are the same as has been described with respect to FIG. 8*a* and FIG. 8*b*. In this case, a conductive electrode 1170 (for example Nb metal) on a different side of the CNT from pull electrode 850 can be used to pull the CNT from a contact condition with the conductive layers 815 through the application of a DC bias voltage ($V_{up}$), in a similar manner as is used to turn the switch ON. The electrode 1170 can be easily integrated with the RF CNT switch fabrication process, by requiring the provision of an additional dielectric 1160 and conductive layer 1170.

In another embodiment, CNT switches can be provided in a form that is variously referred to as a "vertical switch," a "3D switch," or as a switch in which the CNT is grown perpendicular to the surface of the substrate. Procedures that can be employed for growing a CNT in an aligned orientation perpendicular to the surface of the substrate are now described.

Figure 12:
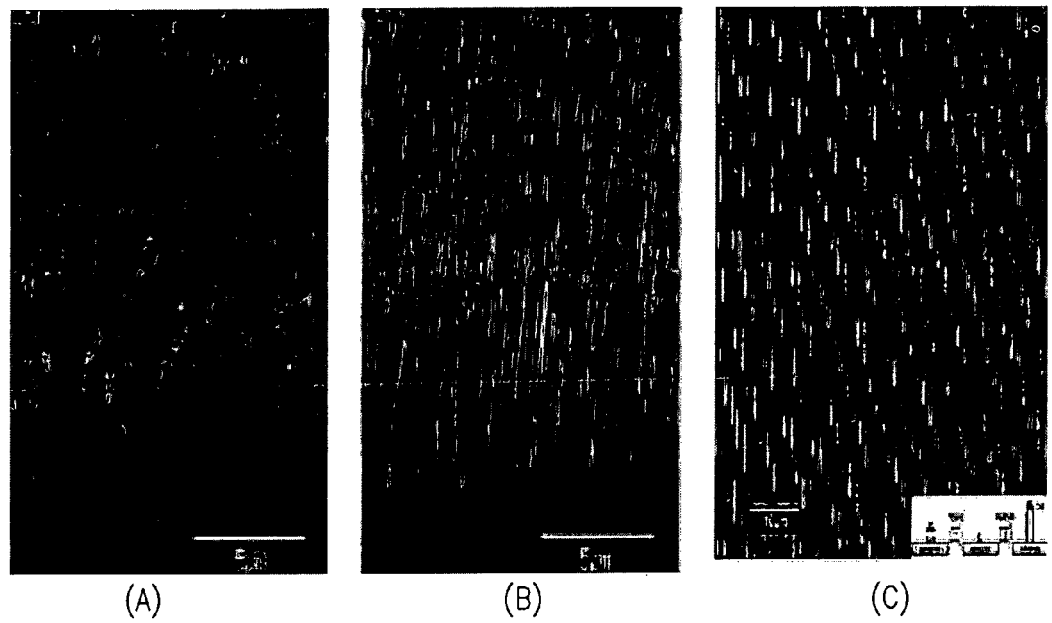
FIG. 12a is a SEM image showing "mats" of curly carbon nanotubes grown using conventional CVD.
FIG. 12b is a SEM image showing vertically aligned, rigid carbon nanotubes grown using dc PECVD.
FIG. 12c is a SEM image showing isolated, needle-like carbon nanotubes grown using dc PECVD.

Two approaches for vertically aligning the tubes are available: (1) thermal chemical vapor deposition (CVD) with an externally applied E-field, and (2) plasma enhanced chemical vapor deposition (PECVD). In the absence of an E-field in thermal CVD, the thin film catalyst nucleates the growth of "mats" of nanotubes at typical growth temperatures of 600-700° C., as shown in FIG. 12*a*. In PECVD, electric fields in the plasma serve the important role of aligning the tubes during growth, and because of gas dissociation, nanotube formation also occurs at a lower temperature. A detailed review of the growth physics involved in the synthesis of vertical CNTs using dc PECVD is provided by Melechko et al. The enhanced vertical alignment can be seen in FIG. 12*b* which is an SEM image of nanotubes grown from a large catalyst film using dc PECVD. The nucleation and growth of single, isolated CNTs is also seen to result in highly uniform, vertically aligned MWNTs, as shown in FIG. 12*c*. These isolated, vertically aligned, needle-like structures are ideal elements for the 3D CNT switch. Recent studies have shown that alignment of MWNTs can be obtained in thermal CVD without plasma enhancement by applying external biases of ~1-2 V/μm.

A compatible and simpler technique for forming the 3D CNT switch utilizes a Silicon-On-Insulator (SOI) substrate. The structure schematic and a description of the general process flow is provided in conjunction with FIG. 13.

Figure 13:
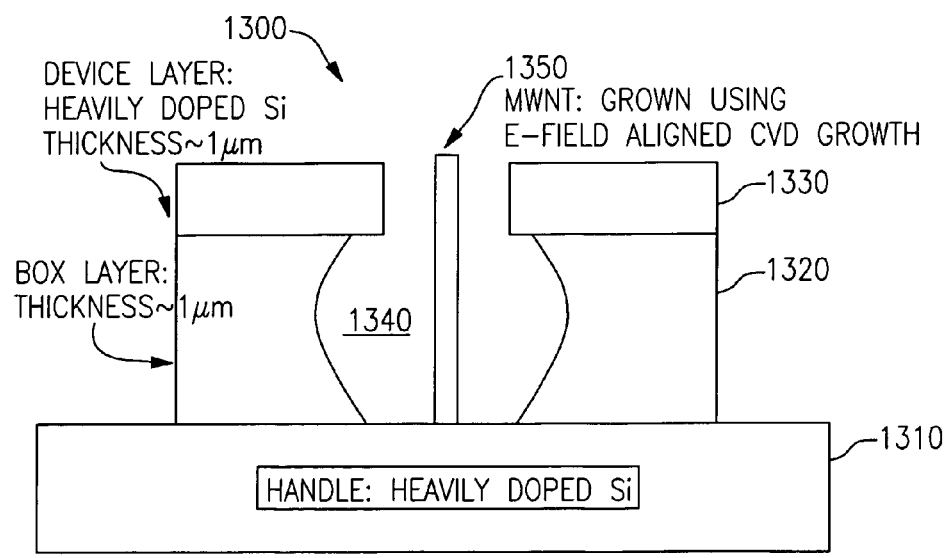
FIG. 13 is a schematic cross sectional diagram showing an embodiment of a vertical CNT switch that is fabricated using a process that employs "SOI" wafers.

FIG. 13 is a schematic cross sectional diagram showing an embodiment of a vertical CNT switch 1300 that is fabricated using a process that employs silicon-on-insulator ("SOI") wafers. The SOI wafer shown in FIG. 13 comprises a heavily-doped silicon HANDLE layer 1310, a Buried-OXide (BOX) layer 1320, and a Si-device layer 1330. The HANDLE layer 1310 and the silicon device layer 1330 will form the ground and actuating electrodes, respectively, for the switch. A nanopocket 1340 is patterned in the device layer 1330 and the BOX layer 1320, and is wet etched to result in the formation of a slight undercut. The Fe/Al catalyst is then deposited using lift-off and the CNT 1350 is grown using an E-field aligned CVD growth process. The process is simple and utilizes a self-aligned technique for forming the actuating electrodes.

The thickness of the BOX layer 1320 and the device layer 1330 determine the length of the tubes required for the switch which can be controlled by growth time. In the embodiment shown in FIG. 13, the BOX layer 1320 and the device layer 1330 are each 1 micron thick. Since the actuating electrodes are formed using an integral part of the SOI wafer, the electrode patterning process is self-aligned.

Figure 14:
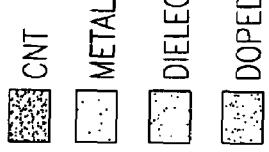
FIG. 14 is a schematic drawing in cross section that illustrates a second exemplary embodiment of a CNT vertical switch.
Figure 14:
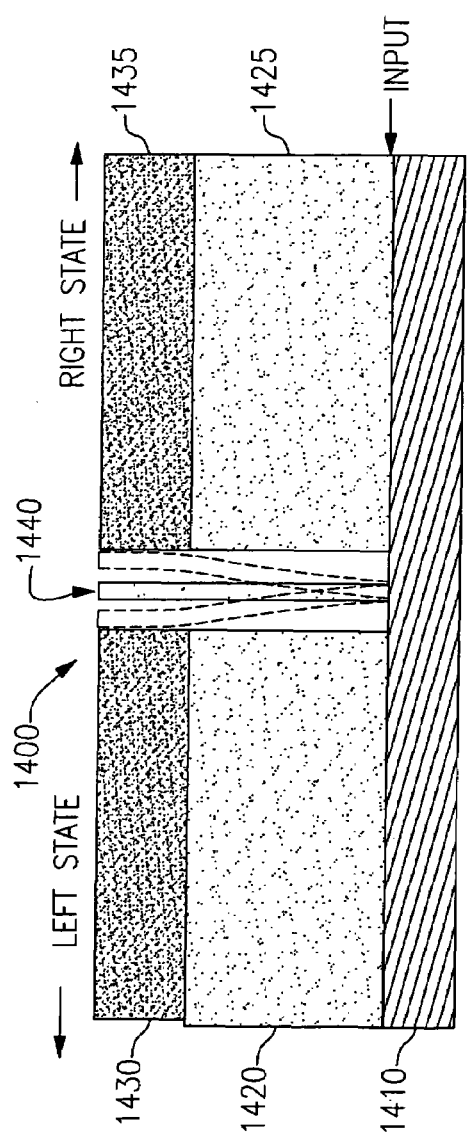
Figure 15:
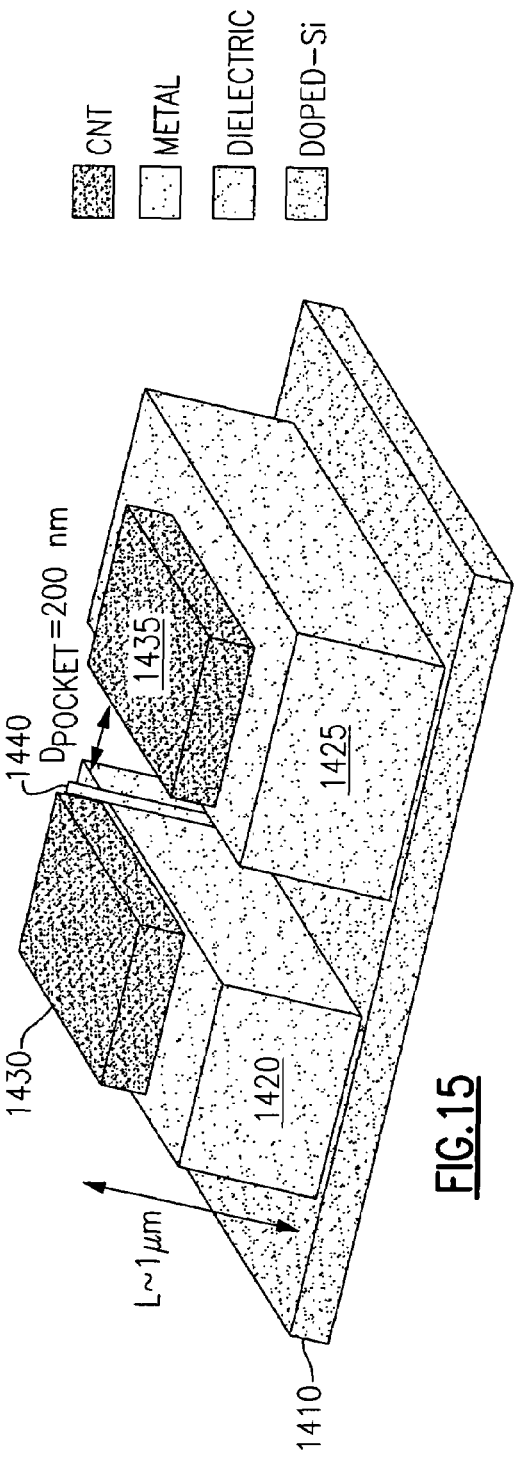
FIG. 15 is a schematic drawing in perspective that illustrates the embodiment of the CNT vertical switch of FIG. 14.

FIG. 14 is a schematic drawing in cross section that illustrates a second exemplary embodiment of a CNT vertical switch 1400. FIG. 15 is a schematic drawing in perspective that illustrates an exemplary embodiment of the CNT vertical switch of FIG. 14. The CNT switch of FIG. 14 comprises a CNT 1440 grown in a direction perpendicular to the plane of a substrate directly on a conducting substrate 1410 such as a heavily doped Si-substrate. CNTs have been shown to grow directly on a heavily doped-Si substrate with the use of a thin Al inter-layer beneath an Fe-catalyst. The substrate thus serves as the common contact to the CNT.

In the embodiment of FIG. 14, a CNT 1440 is attached a one end to a substrate 1410 that serves as one electrical contact. In the embodiment of FIG. 14 the CNT 1440 is not metallized. The CNT 1440 has a free end in close proximity to two (or more) electrodes 1430, 1435 that can cause the CNT to displace when a suitable bias voltage is applied between the substrate 1410 and the respective electrode 1430, 1435. As has been explained, when a DC bias voltage is applied to the CNT and the electrode, charge is caused to redistribute, which results in an electrostatic force on the CNT, causing it to bend.

In the vertical CNT switch of FIG. 14, the CNT switch can be driven into two bi-stable states, ON and OFF. When a critical distance between the CNT and the electrode is reached, the CNT rapidly moves to the electrode, thereby turning the switch into the ON state. Upon removal of the DC bias, the tension or the elastostatic force on the CNT will spring it back to the OFF state.

As shown in the CNT vertical switch 1400 of FIG. 14, the switch can be operated in the normally closed or normally open state. When a DC bias is applied between the base of the CNT (e.g., to the substrate 1410) and the left metal electrode 1430, an electrostatic force is developed which causes the tube to deflect to the left. When the voltages are high enough that physical contact is made to this electrode, the left state is "activated" or "turned-on". Similarly, as voltages are applied to the right electrode 1435, the tube can be bent toward this electrode, causing the right state to be active. In this configuration, a data stream can be transmitted into either the left or right poles, providing a two state multiplexer (or "MUX") or a switch having a single-pole-double-throw switch configuration.

Figure 16A:
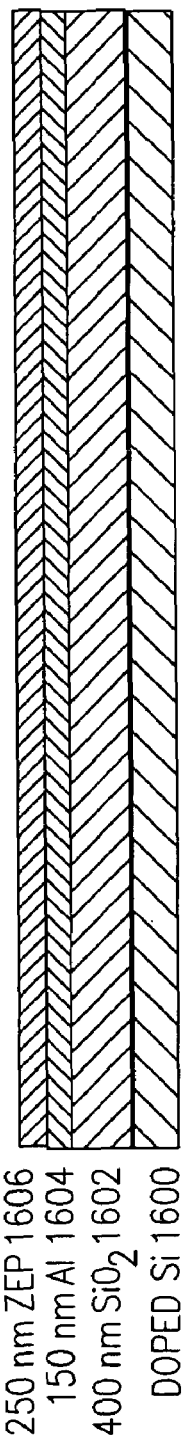
FIG. 16 is a diagram that comprises 15 steps, enumerated in conjunction with FIG. 16a through FIG. 16o, illustrating in cross sectional elevation, and not to scale, the steps of a process for constructing the vertical CNT switch shown in FIG. 14.

FIG. 16 is a diagram that comprises 15 steps, enumerated in conjunction with FIG. 16a through FIG. 16o, illustrating in cross sectional elevation, and not to scale, the steps of a process for constructing the vertical CNT switch shown in FIG. 14. The process comprises a series of steps, some of which are well known in the material processing arts. To form a CNT vertical switch one begins with a doped Si wafer 1600 having a thermally oxidized 400 nm $SiO_2$ layer 1602 grown thereon. A layer of 150 nm of Al 1604 is deposited on the $SiO_2$ layer, on top of which 250 nm of ZEP photoresist 1606 is deposited. This structure is shown in FIG. 16a. In the successive drawings, only the features that have changed from the previous drawing will be described.

Figure 16B:
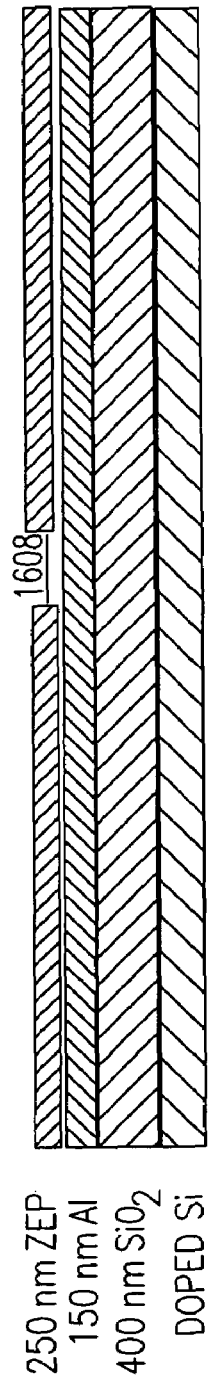

ZEP is a chain-scission positive-tone photoresist (available from Zeon Corporation, Shin Marunouchi Center Building, 1-6-2 Marunouchi, Chiyoda-ku, Tokyo 100-8246, Japan; see http://www.zeon.cojp/press_e/971201_1.html) that is based upon poly(methyl-α-chloroacrylate-co-α-methylstyrene). ZEP series photoresists offer high resolution and excellent dry-etching resistance for device fabrication. The series is well suited to ultra-fine processing. Additional information about the use of ZEP is available from the nanofabrication facility at Cornell University; see http://www.cnf.cornell.edu/cnf_process_ebl_resists.html As illustrated in FIG. 16b, the ZEP photoresist is patterned using an electron beam ("e-beam") exposure system, and the pattern is developed. Regions are defined in the photoresist for a CNT growth pocket 1608 in the $SiO_2$ layer. In various embodiments, the CNT growth pocket 1608 has a width selected from one of 50 nm, 100 nm, 150 nm and 200 nm. In some embodiments, structures are provided, which are called "chip marks" for assuring that successive layers of the structure are deposited in registry with one another. These chip marks are not shown in the elevation drawings of FIGS. 16a through 16o. As will be understood, the example illustrated in FIG. 16 is simply one CNT vertical switch; it should be appreciated that a plurality of such CNT vertical switches can be fabricated simultaneously on one substrate, and that in a properly designed fabrication system, a plurality of wafers will be processed simultaneously.

Figure 16C:
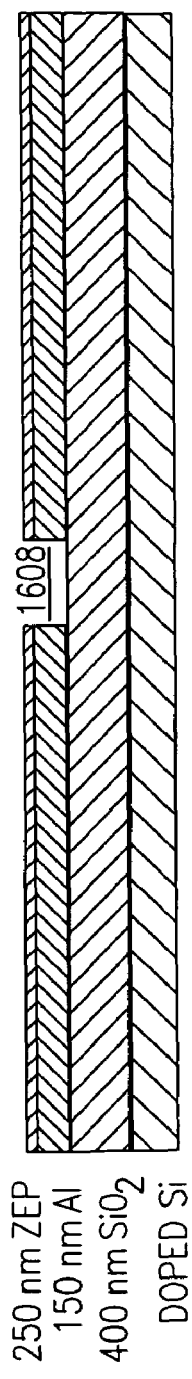

As illustrated in FIG. 16c, an etching step using mixed $BCl_3/Cl_2$ gas in an inductively coupled plasmas etch ("ICP etcher") the exposed regions of the Al layer 1604 are etched, as is a portion of the ZEP photoresist. At this point in the process end point detection ("EPD") is used to determine when the removal of the Al by etching is completed, which is identified by measuring an increase in resistance when the dielectric is reached.

Figure 16D:
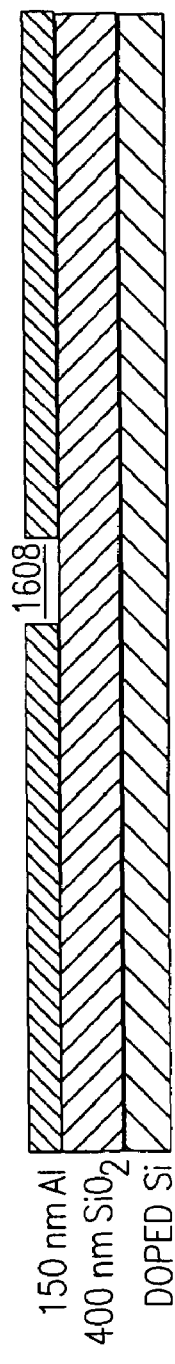

As illustrated in FIG. 16d, the structure is shown in cross section after the ZEP resist is stripped in acetone. The surface of the structure is plasma cleaned in $O_2$.

Figure 16E:
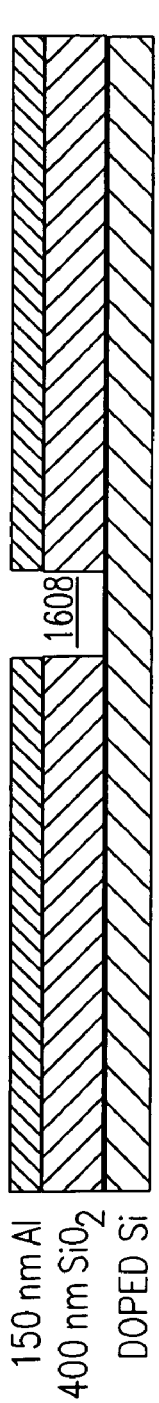

As illustrated in FIG. 16e, the thermal $SiO_2$ is etched in using trifluoromethane ($CHF_3$) in an ICP etcher to produce vertical sidewalls in apertures defined in the structure, such as the pocket 1608. The Al layer serves as an etch mask. Again, EPD is used to determine when the etching is completed by checking for an increase in conductivity to the doped Si-substrate 1600 upon removal of the oxide.

Figure 16F:
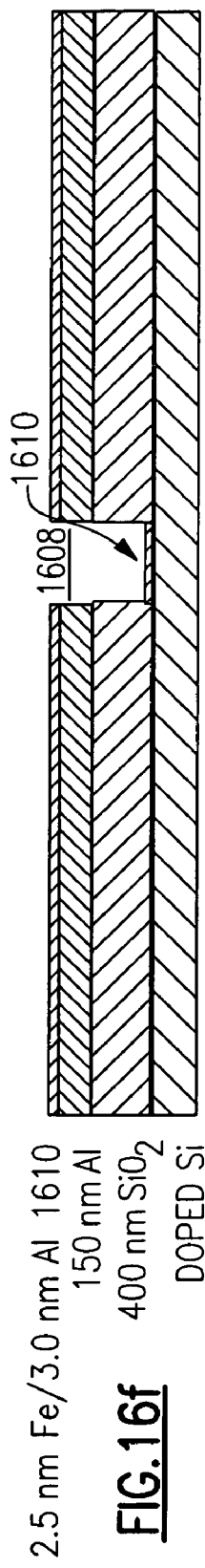

As illustrated in FIG. 16f, Fe/Al catalyst 1610 is deposited, for example by e-beam evaporation. It is believed that in some embodiments, other catalysts may be used, such as Ni, Mo and Co.

Figure 16G:
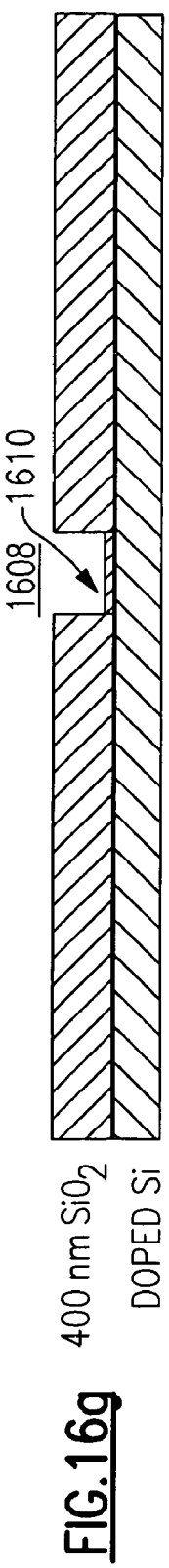

As illustrated in FIG. 16g, the Al layer 1604 is removed by lift-off in TMAH using an ultra-sonic bath at room temperature, leaving the Fe/Al catalyst 1610 in the CNT pocket 1608.

Figure 16H:
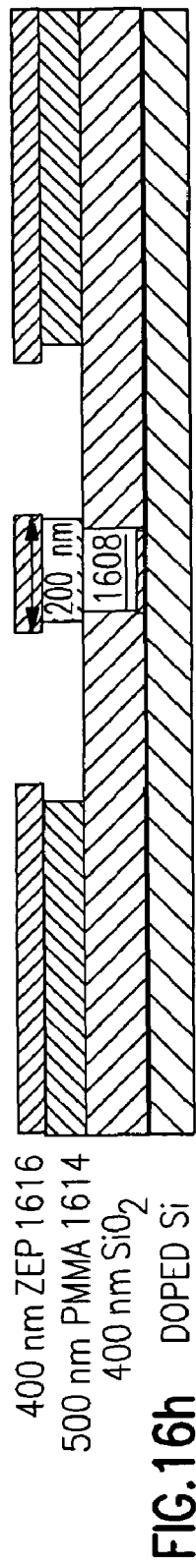

As illustrated in FIG. 16h, a thick layer of PMMA 1614 (500 nm) is deposited, followed by a thick layer of ZEP 1616 (400 nm) in which apertures for depositing a plurality of actuator pads (which may include an undercut) are photolithographically defined and etched.

Figure 16I:
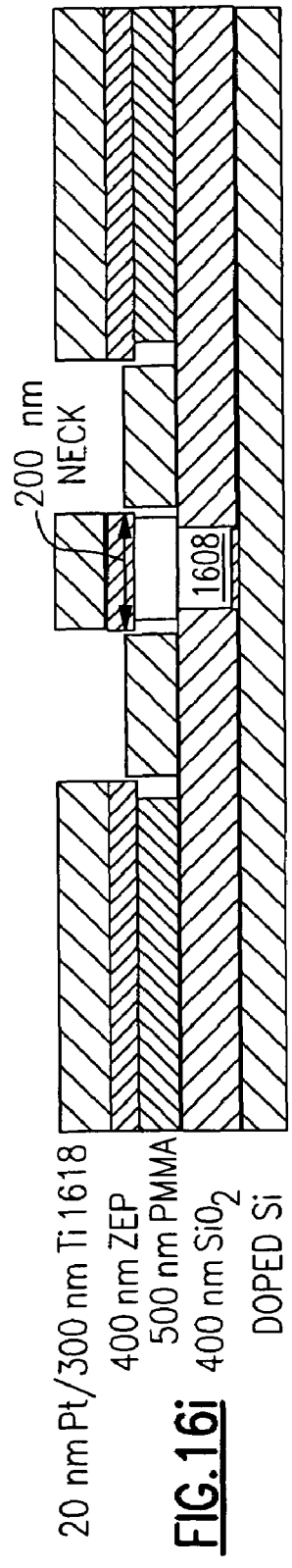

As illustrated in FIG. 16i, metal (20 nm Pt/300 nm Ti) 1618 is deposited, preferably using evaporation methods, which metal 1618 is used for electrodes. In some embodiments, sputtered Nb can be used as well as Pt/Ti.

Figure 16J:
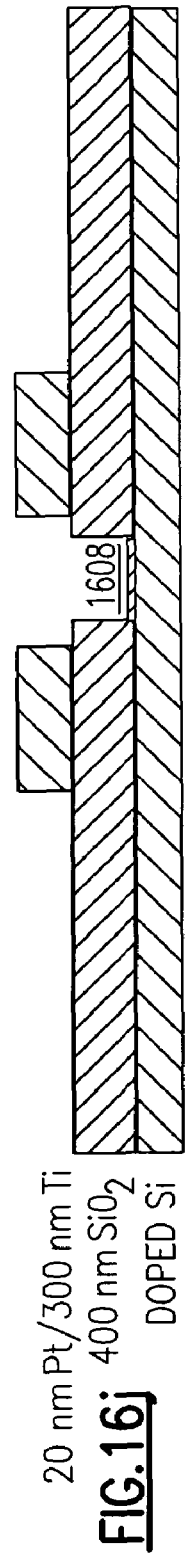

As illustrated in FIG. 16j, the layers of PMMA 1614 and ZEP 1616 are lifted off in acetone, leaving the Ti/Al electrode metal 1618 in place in the structure adjacent the CNT pocket 1608.

As illustrated in FIG. 16k, using a bi-layer of ZEP resist/PMMA 1620, there are defined pad contacts to left-right electrodes which can be seen optically for ease of making connections, by evaporating contact metal 1622 (for example, additional 20 nm Pt/300 nm Ti).

As illustrated in FIG. 16*l*, a lift-off process in acetone is used to remove the PMMA/ZEP/excess metal.

As illustrated in FIG. 16*m*, a via 1624 is opened to provide an aperture to make a contact to the conductive substrate 1600, for example to define a reference voltage on the conductive substrate, such as ground potential, or Zero volts.

As illustrated in FIG. 16*n*, the carbon nanotube 1630, which may be a SWNT, is grown perpendicular to the substrate from the Fe/Al catalyst location using a CVD process at 575 to 700° C., in order to promote the growth of SWNTs. In some growth processes, temperatures as high as 950° C. or more may be used. Various temperatures that have been employed for CNT growth in different situations and in different apparatus include temperatures above 500° C., temperatures at or above 700° C., temperatures at or above 850° C., temperatures at or above 950° C., and temperatures of approximately 1050° C.

As illustrated in FIG. 16*o*, as needed, a grazing angle ion milling process using Argon ions (Ar+) at energies of 350 eV is applied to trim the CNT 1630 to a desired length appropriate to the structure. In FIG. 16*o*, the cross section through a CNT vertical switch device is shown, including contact pads 1640, 1642 for making external connections to each of the plurality of pull electrodes 1632, 1634.

Multi-Throw Switch or Multi-State Memory

Figure 17:
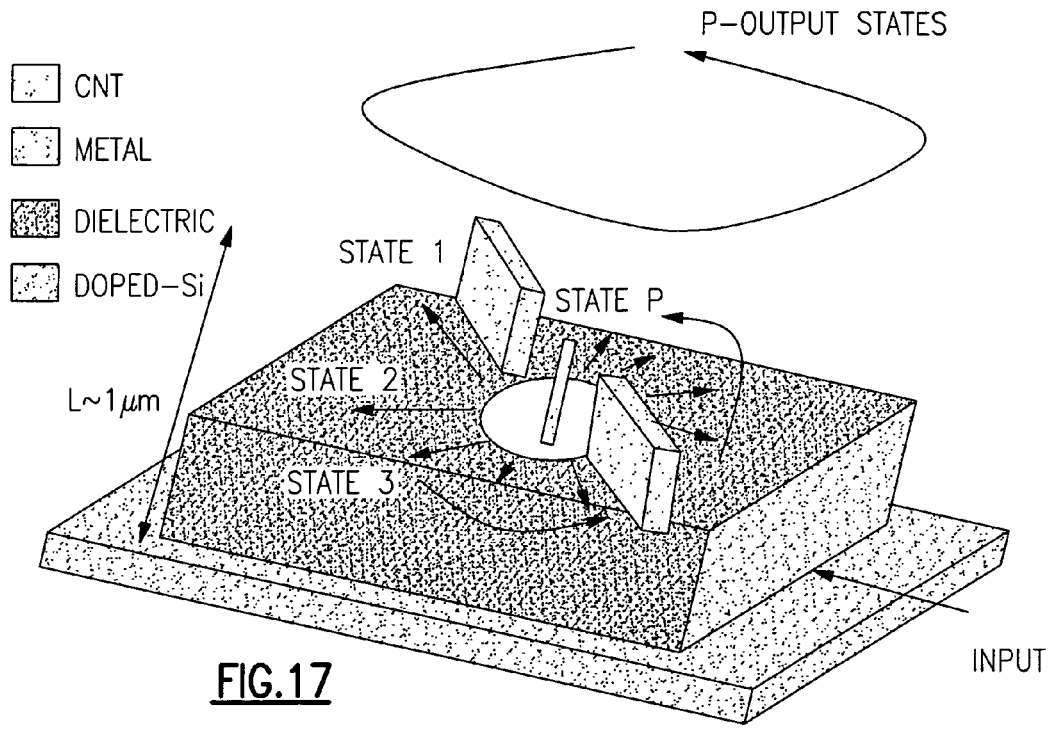
FIG. 17 is a perspective schematic diagram of another embodiment of a CNT vertical multi-throw switch that can provide switching into N independent states.

The CNT vertical switch shown in FIG. 14 exhibits switching in two independent states. FIG. 17 is a perspective schematic diagram of another embodiment of a CNT vertical multi-throw switch that can provide switching into N independent states. Each of the N independent states can represent a value in a memory, or can represent a switching path in a device such as a multi-pole MUX. In operation, the switch depicted in FIG. 17 can be used as a computation device operating in a system base-N, rather than in the convention base-2 (binary) computational system used in conventional digital processors today.

In the embodiment of FIG. 17, metal electrodes can be defined around the CNT growth pocket, and each electrode represents an independent pole. In FIG. 17 there are shown a plurality of poles, labeled "State 1," "State 2," "State 3," and "State P." The more electrodes that can be fit into the periphery of the pocket the higher the number of poles and density of information states possible. As will be explained, for simple switching, such as "on-off" switching, a pole or pull electrode can suffice, and that pull electrode defines and is associated with the state of the switch. For switching a signal to one of a plurality of different paths without corrupting the switched signal, it may be necessary to provide a pull electrode to cause the CNT to move in a specified direction, and a second contact electrode, isolated from the pull electrode, to allow a signal flowing through the CNT as a conductive element to flow from one end of the CNT to the other without superimposing a signal used to cause the CNT to move or to assume a desired configuration. This is analogous to contacts in a relay, in which one set of contacts operates the relay mechanism, and another set of contacts carries the signal or signals that the relay is intended to control or to switch. In this latter situation, a pull electrode is still associated with a particular state or conductive path by causing the CNT to assume a configuration that causes the desired state to be attained.

Figure 18:
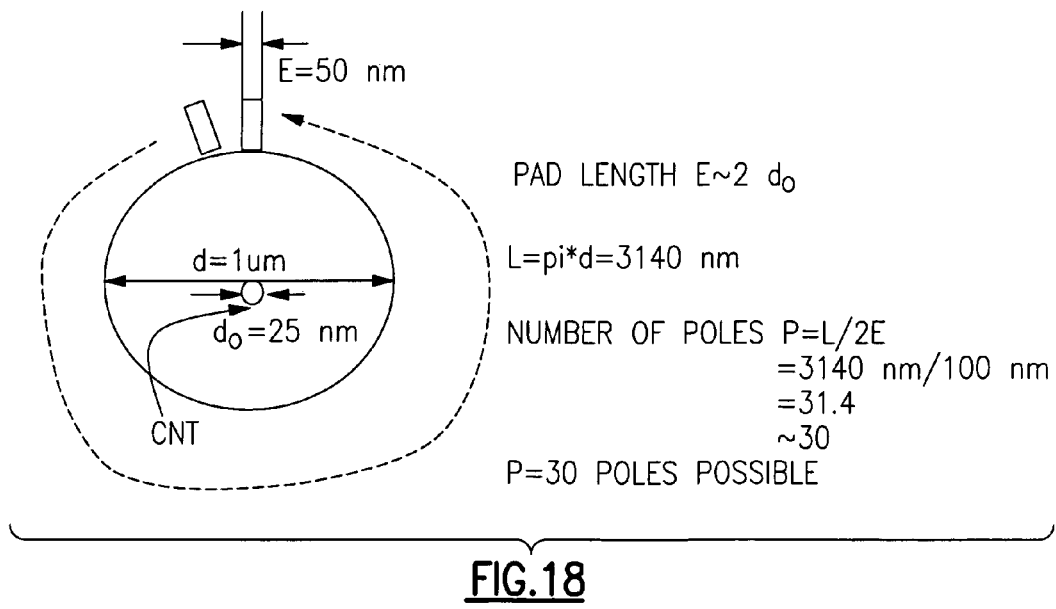
FIG. 18 is a schematic diagram that illustrates a method of estimating the number of states that can be fit within a 1 μm diameter circular CNT pocket assuming 50 nm for e-beam resolution.

FIG. 18 is a schematic diagram that illustrates a method of estimating the number of states that can be fit within a 1 μm diameter circular CNT pocket assuming 50 nm for e-beam resolution. With current e-beam technology, it is possible to define lines that can be as narrow as 50 nm. Given a CNT (which can be a MWNT or a SWNT) with outer diameter $d_o \sim 25$ nm, and metal electrodes pads that are defined as having a pad length E given by E=50 nm wide, the number of poles P that can be physically placed around the pocket is calculated to be ~30. The calculation is shown in FIG. 18. To provide $32=2^5$ poles using these assumptions, one would need 3200 nm of circumference, at 100 nm width per pole, or a circle of diameter 3200/π nm=1019 nm=1.019 μm, or only a slightly larger diameter.

The number of states S in a switch-bank with N=10 switches is determined from $S=P^N$. For a conventional binary switch with P=2, $S=2^{10}=1024$ states are possible (~1 Kilobits or information states). For a multi-throw CNT switch, with P=30 as described, the number of states is calculated to be $S=30^{10}=5.9 \times 10^{14}$ (~590 Terabits or information states). This represents a more than $10^{10}$ order of magnitude improvement in information state density. For the 32 pole configuration, the ratio is easily computed as $(2^5)^{10}/2^{10}=2^{40}=1,099,511,627,776$ or a factor of over 1 trillion times as much information in only 10 32-pole switches as in 10 binary switches.

Stacked Switches

Figure 19:
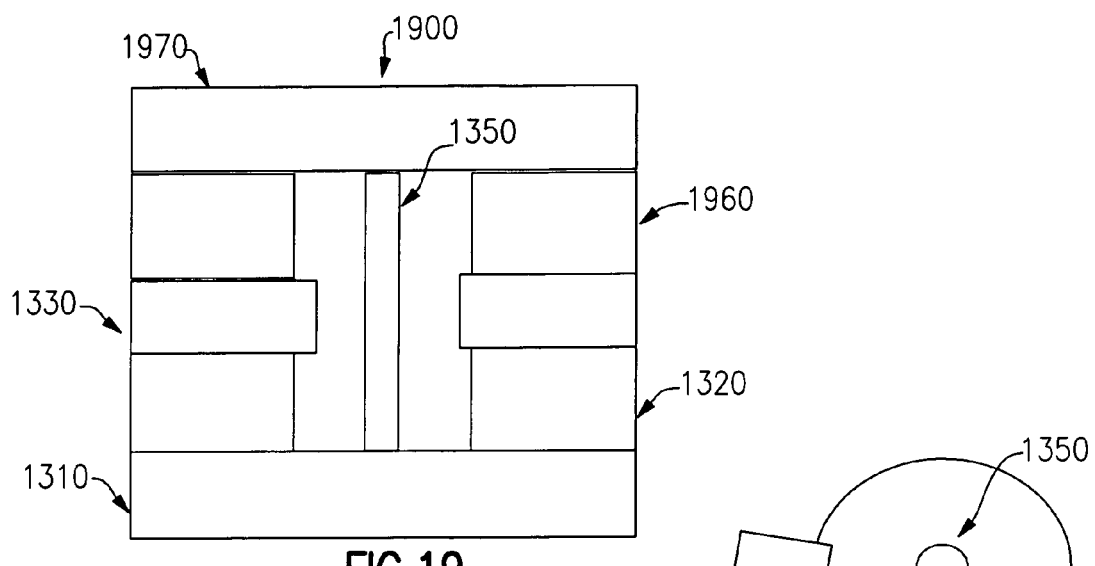
FIG. 19 is a cross sectional schematic diagram of an alternative embodiment of a vertical CNT switch.

FIG. 19 is a cross sectional schematic diagram of an alternative embodiment of a vertical CNT switch 1900. In FIG. 19, a switch of the kind shown in FIG. 13 or FIG. 17 is provided in a modified form. Using the terminology of FIG. 13, an additional dielectric layer 1960 is provided above the conductive layer 1330 of FIG. 13, and a top anchor structure 1970, which can be made from a dielectric, is provided so that the CNT 1350 is retrained at both ends. For this embodiment, it is necessary to grow the CNT 1350 longer than in the embodiment of FIG. 13. Similar modifications can be applied to the switch of FIG. 17 to provide a switch having a CNT that is restrained at both ends.

Figure 20:
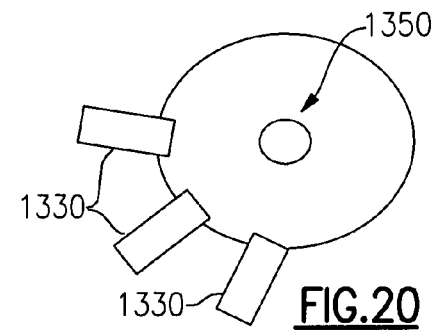
FIG. 20 is a schematic diagram showing a plan view of the vertical CNT switch of FIG. 19.

FIG. 20 is a schematic diagram showing a plan view of the vertical CNT switch of FIG. 19. As in FIG. 17, the switch of FIG. 19 has a plurality of pull electrodes 1330 disposed in a substantially circular configuration, so that the CNT 1350 can contact any of the pull electrodes, or any of a plurality of contact electrodes disposed upon and separated with a dielectric from the pull electrodes, simply by making the CNT 1350 bend in the direction of the pull electrode of interest, without rotating the CNT 1350 about its length axis, and without displacing either end of the CNT 1350.

Figure 21:
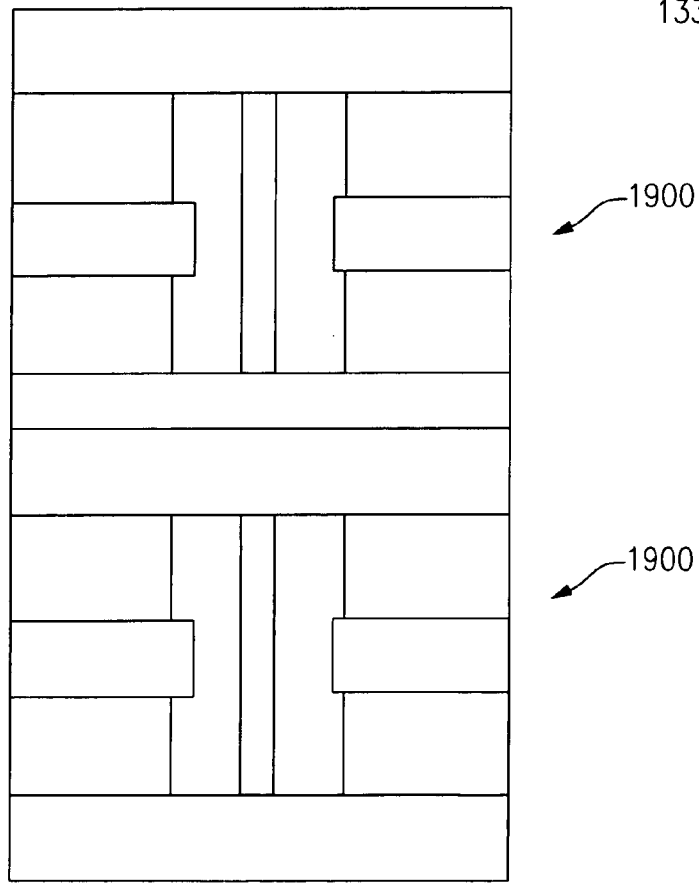
FIG. 21 is a cross sectional schematic diagram showing a plurality of vertical CNT switches of FIG. 19 in a stacked configuration.

FIG. 21 is a cross sectional schematic diagram showing a plurality of vertical CNT switches 1900 of FIG. 19 in a stacked configuration. As will be understood, building stacked switches as shown in FIG. 21 can be useful in providing high density arrays of switches. In addition, providing stacked switches saves "real estate" on a chip, and allows the same area to be a substrate for a larger number of devices than would be possible without stacking.

Other Applications

Figure 22:
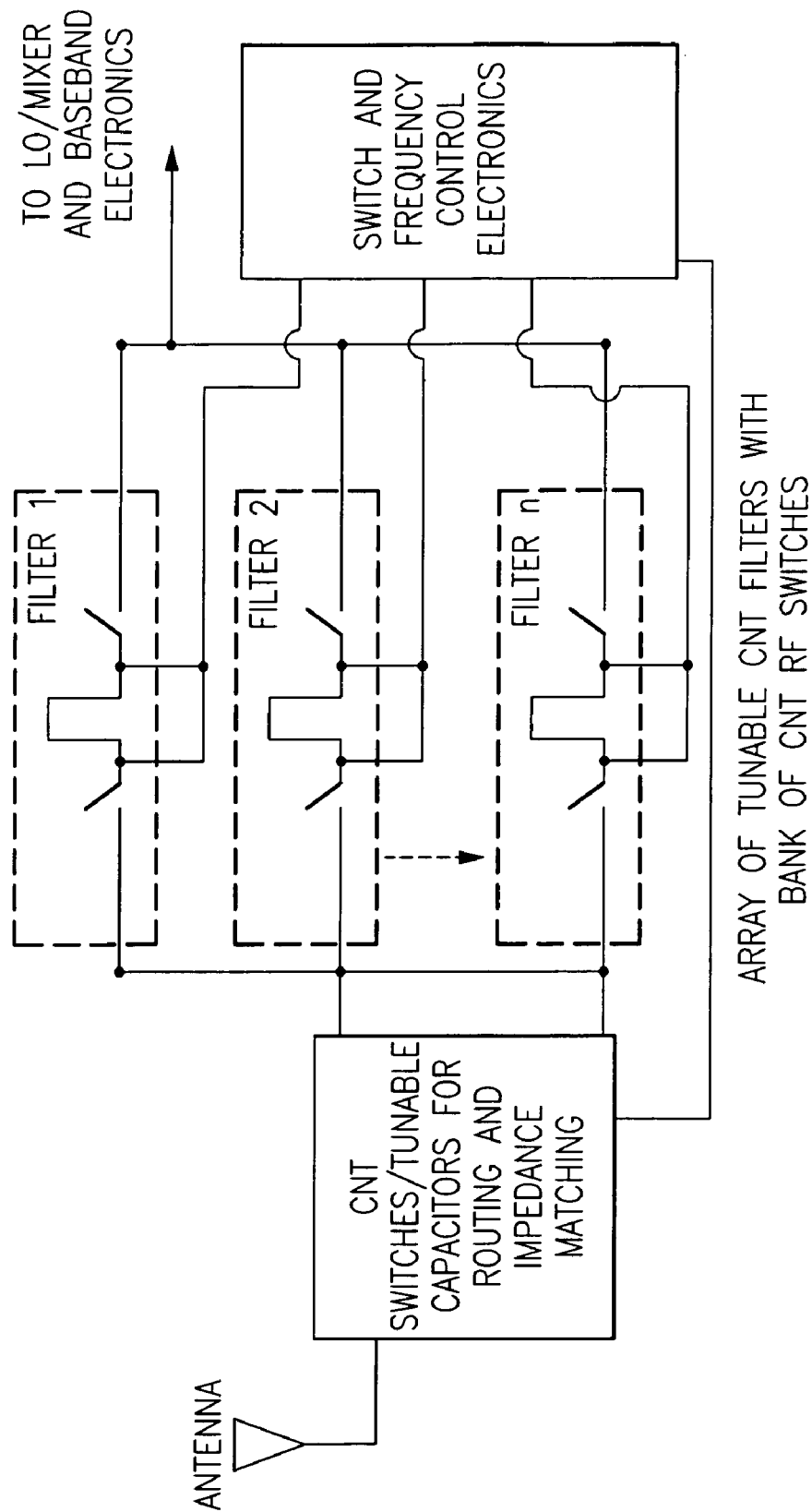
FIG. 22 is a schematic diagram of a first exemplary application of a CNT switch of FIG. 8 or a tunable capacitor constructed according to principles of the invention.

FIG. 22 is a schematic diagram of a first exemplary application of a CNT switch of FIG. 8 or a tunable capacitor constructed according to principles of the invention. FIG. 22 shows an exemplary integrated CNT-based tunable/switchable filter bank that can be used in the RF front-end of a transceiver for routing and transmitting data at a wide bandwidth (spanning frequencies of filter 1 through filter n). Tuning individual CNT filters is possible by changing lengths of CNTs to change resonance frequency. A bank of RF CNT switches can be integrated with the resonators/filters designed for different frequency bands to enable an ultra-low power, high data rate, wide band width CNT-based transceiver architecture.

Tunable Capacitor

When a potential difference is applied between the CNT and a bottom electrode as shown in FIG. 2, FIG. 4 or FIG. 8, it causes an electrostatic force to develop which drives the CNT closer to the electrode, causing the system capacitance to increase.

In each of these switch geometries, when a potential difference is applied between the CNT and an electrode, it causes an electrostatic force to develop which drives the CNT closer to the electrode, causing the system capacitance to increase. As the voltage is increased further, the air-gap continues to decrease and the capacitance continues to increase more, in a manner given by:

$$V = \sqrt{\alpha K \left(1 - \frac{C_0}{C}\right)\left(\frac{C_0}{C}\right)^2}$$

where $$K = \frac{Ebh^3 d^3}{\varepsilon_0 A L^3}$$

where $C_0$ is the initial system capacitance, E is the elastic modulus, b and h are the beam width and thickness, respectively and d is the air-gap spacing; $\varepsilon_0$, A and L are the permittivity, area and length of the beam, respectively; $\alpha$=32 for a fixed-fixed beam. The maximum tuning range on the capacitor is 1.5 $C_0$, since at ⅔ of the initial air-gap, the CNT will be unstable and collapse to a bottom electrode.

In addition, by having the CNT suspended in air, the dielectric loss that usually limits the self-resonance frequency and thus the Q of typical dielectric-filled capacitors, is avoided since the losses in air are negligible. Thus the geometry described here can be used to realize a high-Q, voltage tunable nano-capacitor. This device can be used in conjunction with the RF switch for tuning purposes in a transceiver architecture as shown in FIG. 22.

ESD or Under-Voltage/Over-Voltage Sensor

FIG. 23 is a schematic diagram showing an exemplary use of CNT switches of FIG. 1 or FIG. 4 constructed according to principles of the invention as an ESD or overvoltage/undervoltage sensor.

The CNT switch has ultra-low switching times, of the order of fractions of nanoseconds. In the normally open state of operation, if the switch experiences a voltage that is greater than its actuation voltage or $V_{over-threshold}$ as shown in FIG. 23, due to, for example, a voltage transient or an ESD pulse, the switch will react by closing and re-directing the signal so that voltage-sensitive circuitry is protected. In a similar fashion, if the switch is operated in the normally closed state, and an under-voltage state is detected where the actuation voltage is designed to be $V_{under-threshold}$, the switch will react by deactivating and opening. Since the reaction time of the switch is fast, it will be ideally suited for ESD sensing, where the pulse widths are of the order of nanoseconds. In addition, typical voltage-transient sensors such as Zener diode sensors are quite temperature sensitive and bulky. Due to its thermal robustness, the CNT based under/over voltage sensor should be stable with temperature, and, along with its ultra-low mass and fast switching time, it can be used in protecting voltage sensitive circuitry.

Still another potential application of CNT switches as described herein relates to power management. The leakage currents in CMOS technologies present a limit with regard to chip integration, which becomes a more difficult problem in emerging 3D CMOS device scaling. Unlike the leakage current across source and drain in a solid state switch, a nanomechanical switch offers much lower off-state leakage limited only by Brownian motion displacement current and vacuum tunneling currents. Power could be saved (for example, to reduce heating and/or increase battery life) by using a carbon nanotube switch to activate/de-activate components as needed (for example, providing a stand-by mode in a cell phone). For CMOS, computational resources could be cycled on only when required for immediate logic operations and then turned off.

Theoretical Discussion

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

Many functions of electrical and electronic apparatus can be implemented in hardware (for example, hard-wired logic), in software (for example, logic encoded in a program operating on a general purpose processor), and in firmware (for example, logic encoded in a non-volatile memory that is invoked for operation on a processor as required). The present invention contemplates the substitution of one implementation of hardware, firmware and software for another implementation of the equivalent functionality using a different one of hardware, firmware and software. To the extent that an implementation can be represented mathematically by a transfer function, that is, a specified response is generated at an output terminal for a specific excitation applied to an input terminal of a "black box" exhibiting the transfer function, any implementation of the transfer function, including any combination of hardware, firmware and software implementations of portions or segments of the transfer function, is contemplated herein.

While the present invention has been particularly shown and described with reference to the structure and methods disclosed herein and as illustrated in the drawings, it is not confined to the details set forth and this invention is intended to cover any modifications and changes as may come within the scope and spirit of the following claims.

What is claimed is:

1. A method for manufacturing a nanoelectromechanical (NEM) switch comprising the steps of:
   providing a conductive substrate;
   providing a dielectric material on said conductive substrate;
   creating a trench in said dielectric material, said trench having first and second walls extending down to said conductive substrate;
   depositing a refractory metal onto said conductive substrate within said trench, said refractory metal forming a first pull electrode;
   depositing a catalyst on a surface supported by said dielectric material for in-situ growth of at least one carbon nanotube (CNT) across said trench,
   placing said switch in a chemical vapor deposition (CVD) furnace for said in-situ growth;
   growing in-situ said at least one CNT that crosses said trench, said at least one CNT at least mechanically connected to said conductive substrate; and
   after said growth of said at least one CNT, depositing first and second contact electrodes on said opposite ends of said trench to contact said CNT.

2. The method for manufacturing a NEM switch of claim 1, further comprising the step of:
   metallizing a portion of said at least one CNT that is disposed between said first and said second walls of said trench.

3. The method for manufacturing a NEM switch of claim 1, further comprising the steps of:
   depositing a dielectric material onto said first and second contact electrodes; and
   providing a second pull electrode between said dielectric material deposited onto said first and second metal electrodes, said second pull electrode being disposed on a different side of said at least one CNT from said first pull electrode.

4. The method for manufacturing a NEM switch of claim 1, wherein said conductive substrate is a wafer comprising silicon.

5. The method for manufacturing a nanoelectromechanical (NEM) switch of claim 1, wherein said refractory metal is a selected one of Nb, Mo and Ta.

6. The method for manufacturing a nanoelectromechanical (NEM) switch of claim 1, wherein said growth of said CNT is performed at a temperature above 500° C.

7. The method for manufacturing a nanoelectromechanical (NEM) switch of claim 1, wherein said growth of said CNT is performed at a temperature at or above 700° C.

8. The method for manufacturing a nanoelectromechanical (NEM) switch of claim 1, wherein said growth of said CNT is performed at a temperature at or above 850° C.

9. The method for manufacturing a nanoelectromechanical (NEM) switch of claim 1, wherein said growth of said CNT is performed at a temperature at or above 950° C.

10. A method for manufacturing a nanoelectromechanical (NEM) switch comprising the steps of:
   providing a conductive substrate
   defining on a surface of said conductive substrate a location for growing at least one carbon nanotube (CNT);
   depositing at said location for growing at least one carbon nanotube (CNT) a growth catalyst;
   defining a first plurality of locations on said conductive substrate for a first plurality of pull electrodes, said first plurality of pull electrodes when present defining a cavity therebetween;
   depositing a first plurality of pull electrodes, each at one of said first plurality of locations on said conductive substrate, each pull electrode electrically isolated from said conductive substrate; and
   growing in-situ at least one CNT at said defined location for growing said CNT, said at least one CNT at least mechanically connected to said conductive substrate.

11. The method for manufacturing a nanoelectromechanical (NEM) switch of claim 10, further comprising the steps of:
   depositing a dielectric material onto at least some of said first plurality of pull electrodes;
   depositing a second plurality of contact electrodes, each contact electrode being deposited onto a respective one of said dielectric material deposited onto each of said first plurality of pull electrodes; and
   providing a second plurality of external terminals, each external terminal electrically connected to a respective one of said second plurality of contact electrodes.

12. The method for manufacturing a nanoelectromechanical (NEM) switch of claim 11, wherein any of said steps of depositing a dielectric material comprises deposition by plasma enhanced chemical vapor deposition.

13. The method for manufacturing a nanoelectroniechanical (NEM) switch of claim 10, wherein said conductive substrate comprises silicon.

14. The method for manufacturing a nanoelectromechanical (NEM) switch of claim 10, wherein said refractory metal is a selected one of Nb, Mo and Ta.

15. The method for manufacturing a nanoelectromechanical (NEM) switch of claim 10, wherein said growth of said CNT is performed at a temperature above 500° C.

16. The method for manufacturing a nanoelectromechanical (NEM) switch of claim 10, wherein said growth of said CNT is performed at a temperature at or above 700° C.

17. The method for manufacturing a nanoelectromechanical (NEM) switch of claim 10, wherein said growth of said CNT is performed at a temperature at or above 850° C.

18. The method for manufacturing a nanoelectromechanical (NEM) switch of claim 10, wherein said growth of said CNT is performed at a temperature at or above 950° C.

19. A nanoelectromechanical (NEM) switch, comprising: a conductive substrate; at least one carbon nanotube (CNT);
   a dielectric material on said conductive substrate, said dielectric material defining a trench, said trench having first and second walls;
   a refractory metal deposited onto said conductive substrate, said refractory metal situated within said trench and forming a first pull electrode;
   said CNT grown across said trench in-situ in a chemical vapor deposition (CVD) furnace, said CNT at least mechanically connected to said conductive substrate; and
   a first contact electrode and a second contact electrode located on said opposite ends of said trench contacting said CNT.

20. The NEM switch of claim 19, further comprising:
   a plurality of external terminals, each external terminal electrically connected to a respective one of said conductive substrate and said pull electrode.

21. The NEM switch of claim 19, wherein a portion of said CNT situated between said first and second walls of said trench is metallized.

22. The NEM switch of claim 19, further comprising:
   a dielectric material deposited onto said first and second contact electrodes; and
   a second pull electrode between said dielectric material deposited onto said first and second contact electrodes, said second pull electrode being disposed on a different side of said CNT from said first pull electrode.

23. The NEM switch of claim 19, further comprising:
   a plurality of external terminals, each external terminal electrically connected to a respective one of said conductive substrate and said plurality of pull electrodes.

24. The NEM switch of claim 19, wherein said conductive substrate comprises a selected one of a doped silicon wafer and a silicon-on-insulator (SOI) wafer.

25. A nanoelectromechanical (NEM) switch, comprising: a conductive substrate; at least one carbon nanotube (CNT), said at least one CNT grown in-situ and at least mechanically connected to said conductive substrate;
   a first plurality of pull electrodes deposited on said conductive substrate, each pull electrode electrically isolated from said conductive substrate, said first plurality of pull electrodes defining a cavity therebetween;
   said CNT located within said cavity defined by said first plurality of pull electrodes and extending perpendicularly to the conductive substrate, said CNT having been grown in-situ in a chemical vapor deposition (CVD) furnace substantially directly onto said conductive substrate; and a plurality of external terminals, each external terminal electrically connected to a respective one of said conductive substrate and said first plurality of pull electrodes.

26. The nanoelectromechanical (NEM) switch of claim 25, further comprising:

a dielectric material deposited onto each of said first plurality of pull electrodes;

a second plurality of contact electrodes, each contact electrode deposited onto a respective one of said dielectric material deposited onto each of said first plurality of pull electrodes; and a plurality of external terminals, each external terminal electrically connected to a respective one of said second plurality of contact electrodes.

27. The NEM switch of claim 25, wherein said plurality of pull electrodes comprises two pull electrodes located substantially diametrically opposed to each other.

28. The NEM switch of claim 25, wherein said plurality of pull electrodes comprises three or more pull electrodes located in a substantially circular pattern.

29. The NEM switch of claim 25, wherein said NEM switch has a unique state associated with each of said plurality of pull electrodes.

30. The NEM switch of claim 29, wherein said NEM switch is configured as a memory having a unique state associated with each of said plurality of pull electrodes.

31. The NEM switch of claim 29, wherein said NEM switch is configured as a computation device having a unique state associated with each of said plurality of pull electrodes.

32. The NEM switch of claim 29, wherein said NEM switch is configured as multiplexer having a unique signal path associated with each of said plurality of pull electrodes.

* * * * *